United States Patent
Inokuchi et al.

(10) Patent No.: US 8,111,087 B2
(45) Date of Patent: Feb. 7, 2012

(54) SEMICONDUCTOR INTEGRATED CIRCUIT

(75) Inventors: Tomoaki Inokuchi, Kawasaki (JP);
Mizue Ishikawa, Yokohama (JP);
Hideyuki Sugiyama, Kawasaki (JP);
Yoshiaki Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 208 days.

(21) Appl. No.: 12/408,953

(22) Filed: Mar. 23, 2009

(65) Prior Publication Data

US 2009/0243653 A1    Oct. 1, 2009

(30) Foreign Application Priority Data

Mar. 27, 2008    (JP) ................... 2008-084937

(51) Int. Cl.
*H03K 19/094* (2006.01)
(52) U.S. Cl. .......... 326/49; 326/104; 326/108; 326/109; 365/158; 365/170; 257/295
(58) Field of Classification Search .................. 326/38, 326/47, 113, 82, 86, 81, 83, 87; 365/171, 365/158, 189.02, 209
See application file for complete search history.

(56) References Cited

U.S. PATENT DOCUMENTS

| | | | | |
|---|---|---|---|---|
| 5,652,445 | A * | 7/1997 | Johnson ................. | 257/295 |
| 7,200,037 | B2 * | 4/2007 | Saito et al. ............. | 365/158 |
| 7,239,541 | B2 * | 7/2007 | Saito et al. ............. | 365/158 |

FOREIGN PATENT DOCUMENTS

| | | | |
|---|---|---|---|
| CN | 1765054 | A | 4/2006 |
| CN | 101073204 | A | 11/2007 |
| CN | 101127352 | A | 2/2008 |

OTHER PUBLICATIONS

Tomohiro Matsuno, et al., "Novel Reconfigurable Logic Gates Using Spin Metal-Oxide-Semiconductor Field-Effect Transistors", Japanese Journal of Applied Physics, vol. 43, No. 9A, 2004, pp. 6032-6037.
Satoshi Sugahara, et al., "A spin metal-oxide-semiconductor field-effect transistor using half-metallic-ferromagnetic contacts for the source and drain", Applied Physics Letters, vol. 84, No. 13, Mar. 29, 2004, pp. 2307-2309.
Satoshi Sugahara, et al., "A spin metal-oxide-semiconductor field-effect transistor (spin MOSFET) with a ferromagnetic semiconductor for the channel", Journal of Applied Physics, vol. 97, 2005, pp. 10D503-1 to 10D503-3.
Office Action issued Mar. 2, 2011, in China Patent Application No. 200910129709.0 (with English translation).

* cited by examiner

*Primary Examiner* — Shawki S Ismail
*Assistant Examiner* — Christopher Lo
(74) *Attorney, Agent, or Firm* — Oblon, Spivak, McClelland, Maier & Neustadt, L.L.P.

(57) ABSTRACT

A semiconductor integrated circuit includes an n-channel spin FET including one of a magnetic tunnel junction and a magneto-semiconductor junction, the n-channel spin FET including a gate terminal to receive an input signal, a source terminal to receive a first power supply potential, and a drain terminal connected to an output terminal, a p-channel FET including a gate terminal to receive a clock signal, a source terminal to receive a second power supply potential, and a drain terminal connected to the output terminal, a subsequent circuit connected to the output terminal, and a control circuit which turns on the p-channel FET to start charging the output terminal, then turns off the p-channel FET to end the charging, and supplies the input signal to the gate terminal of the n-channel spin FET.

22 Claims, 21 Drawing Sheets

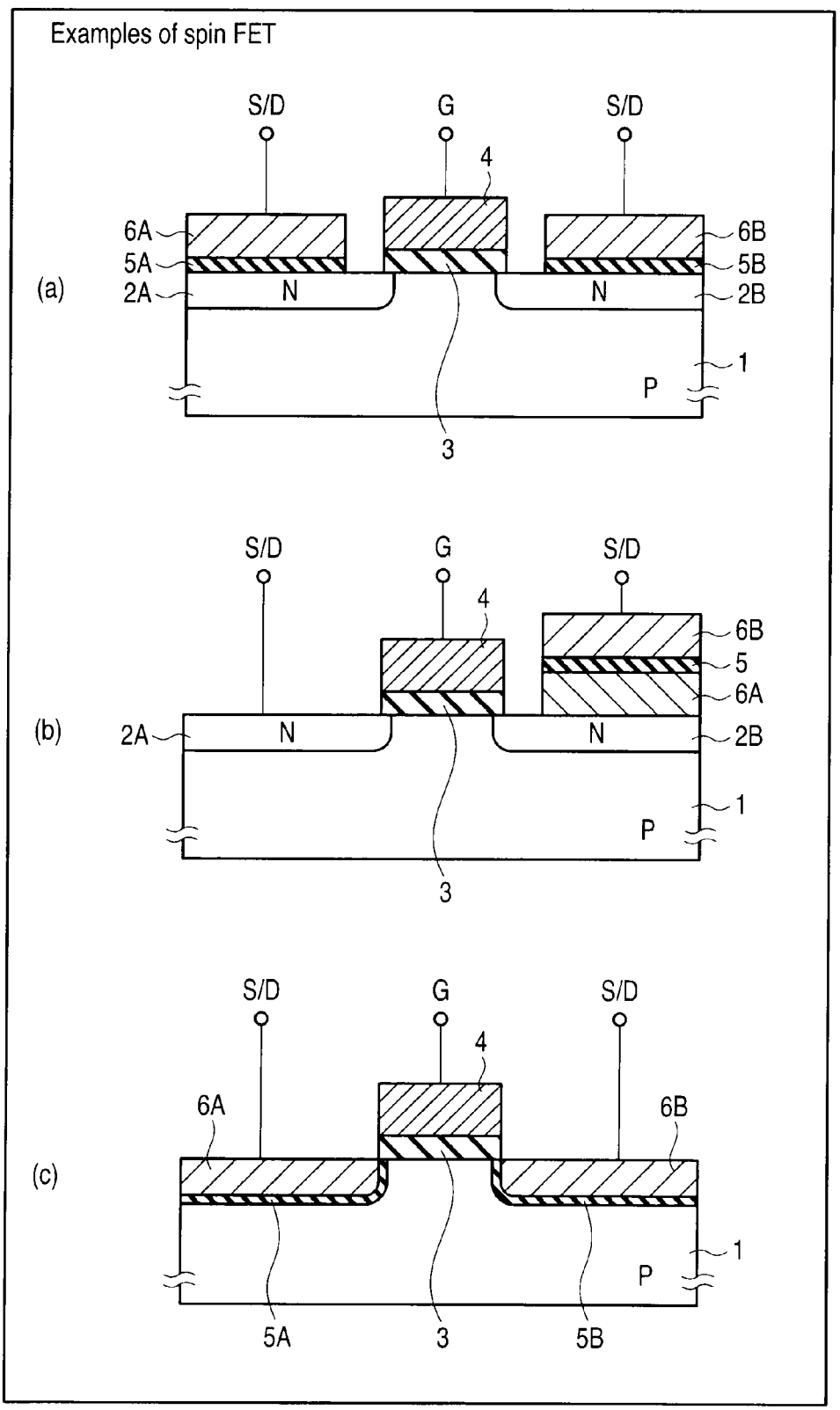
F I G. 2

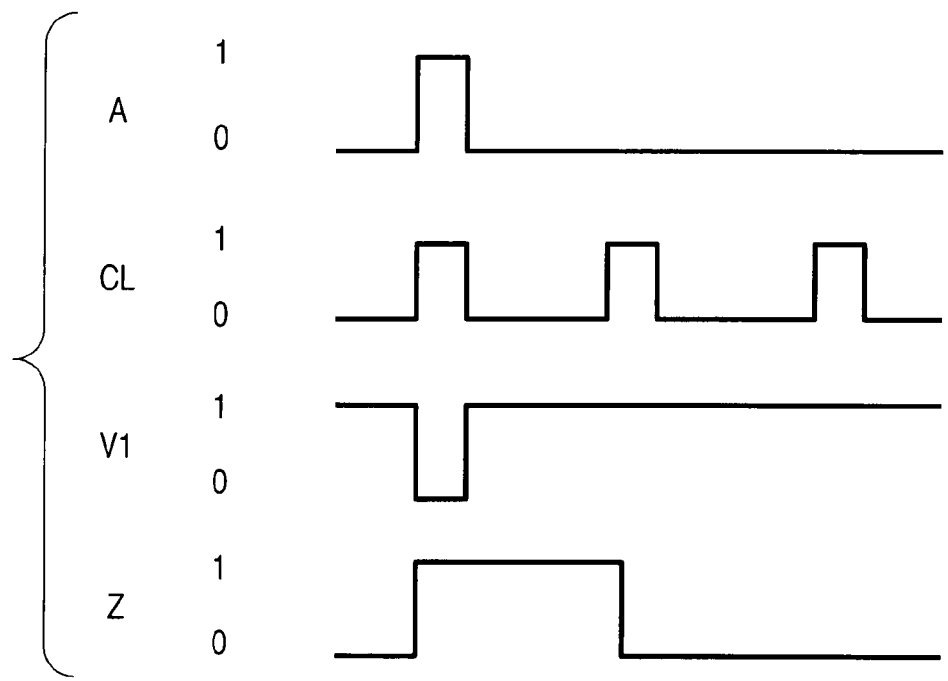
F I G. 5
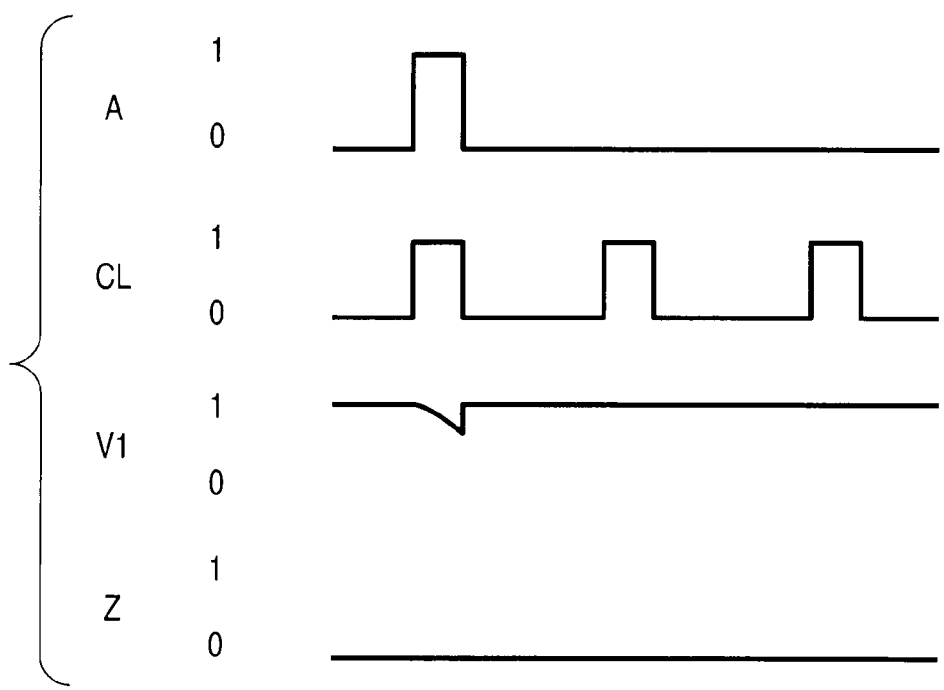
F I G. 6

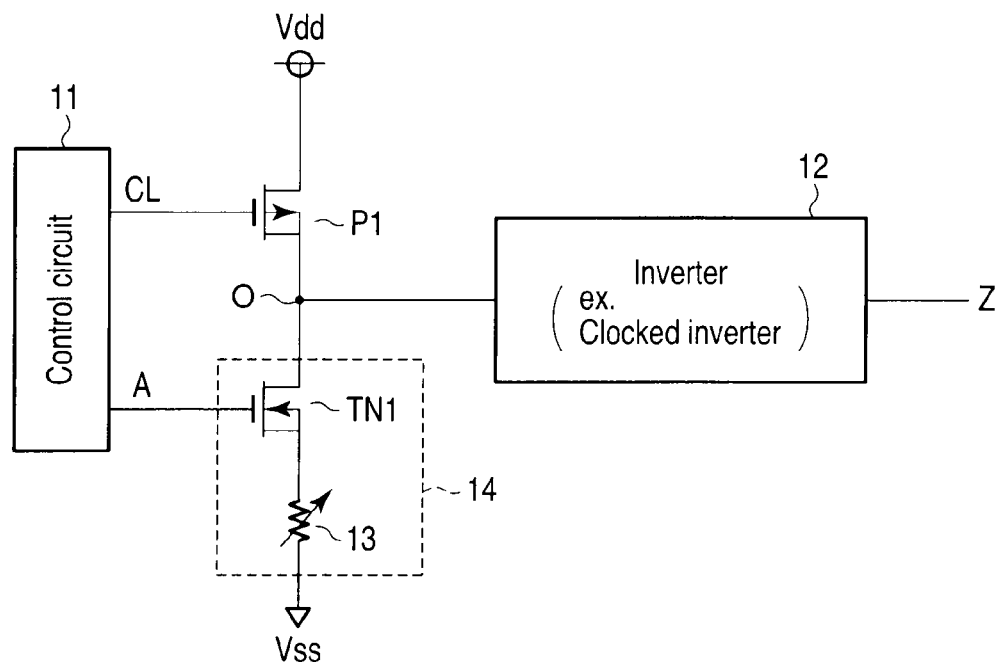
F I G. 8
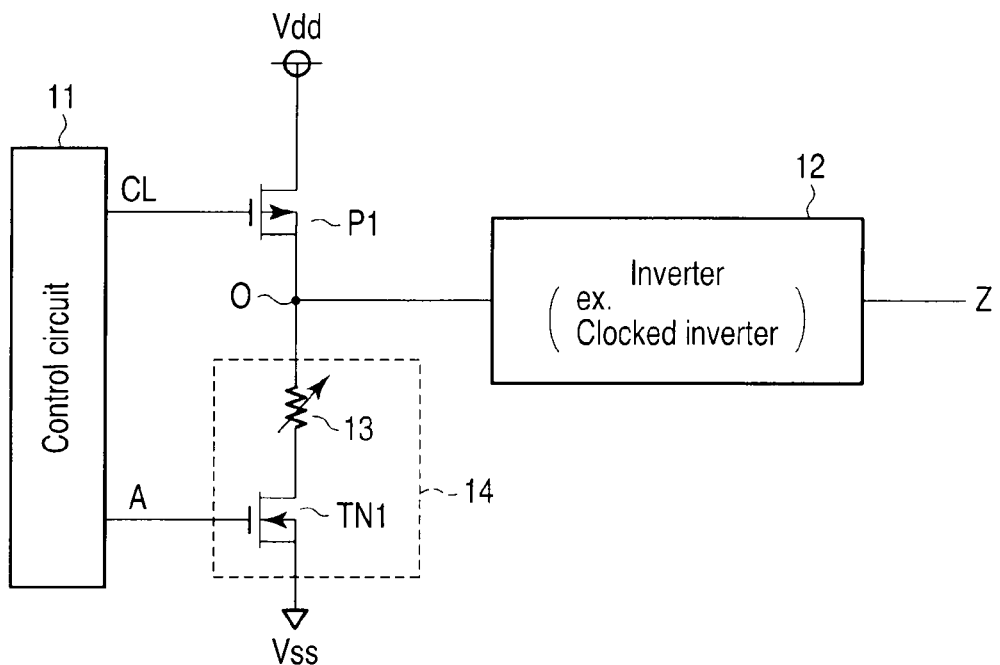
F I G. 9

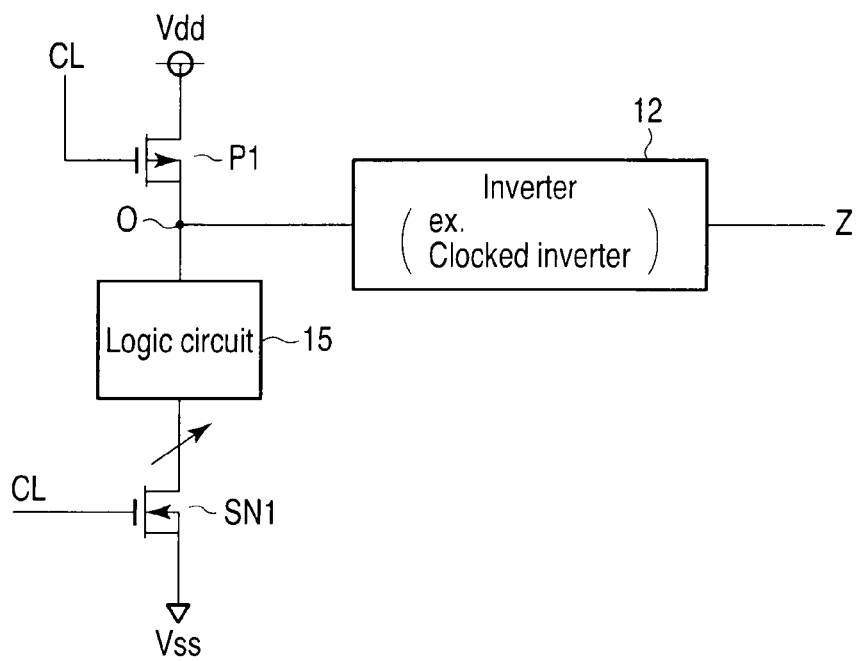
F I G. 12
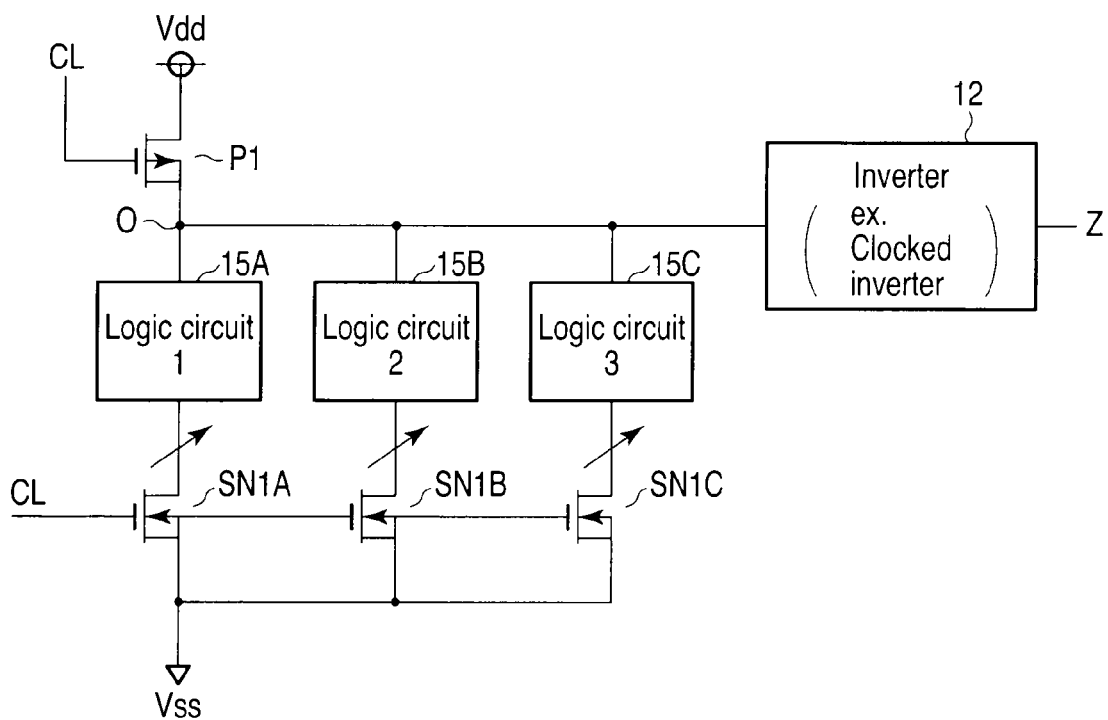
F I G. 13

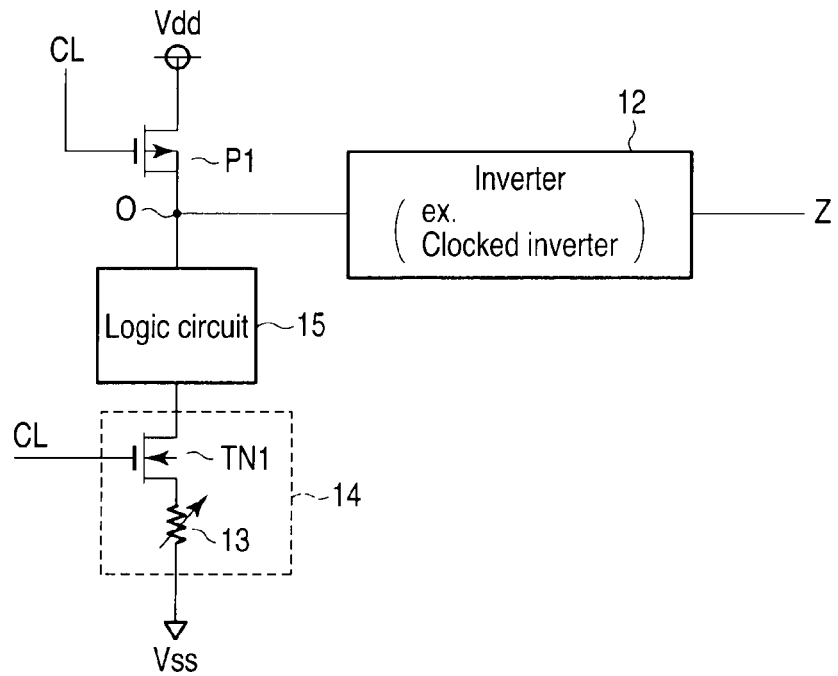
F I G. 14
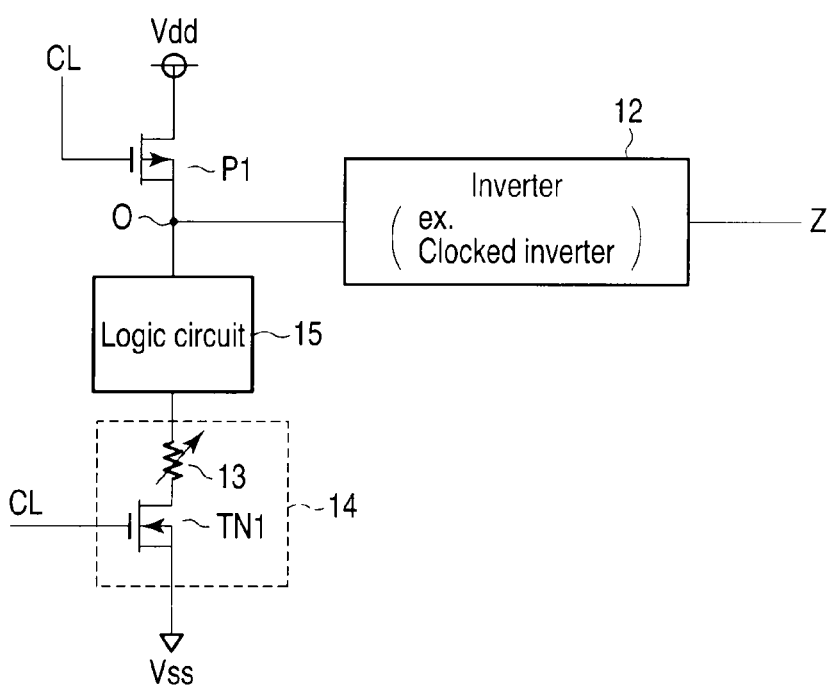
F I G. 15

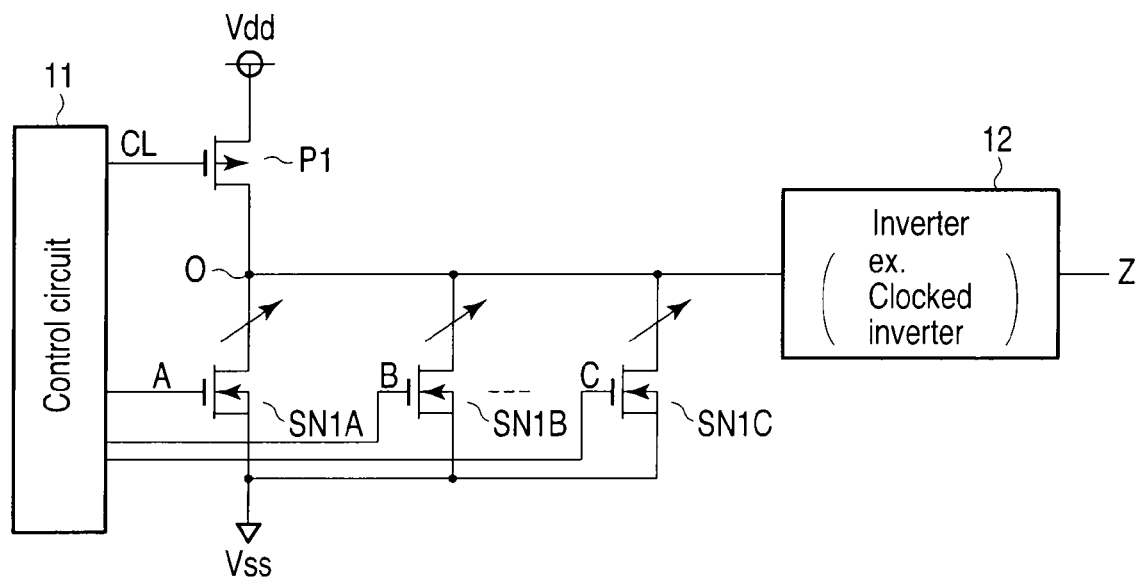
F I G. 18
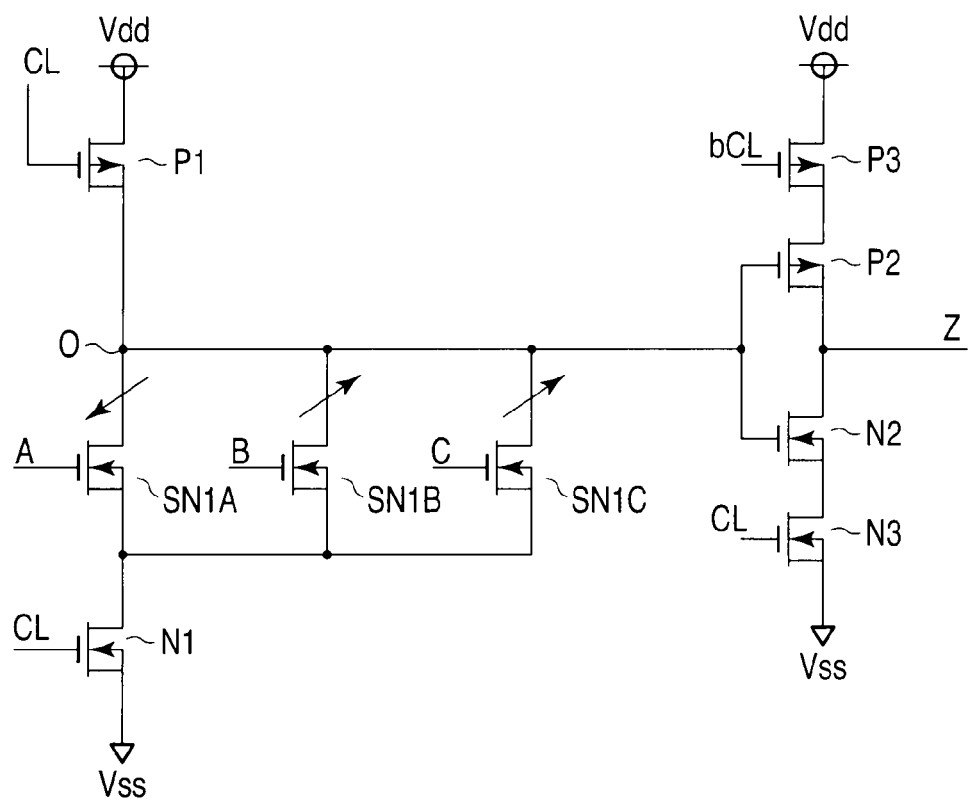
F I G. 19

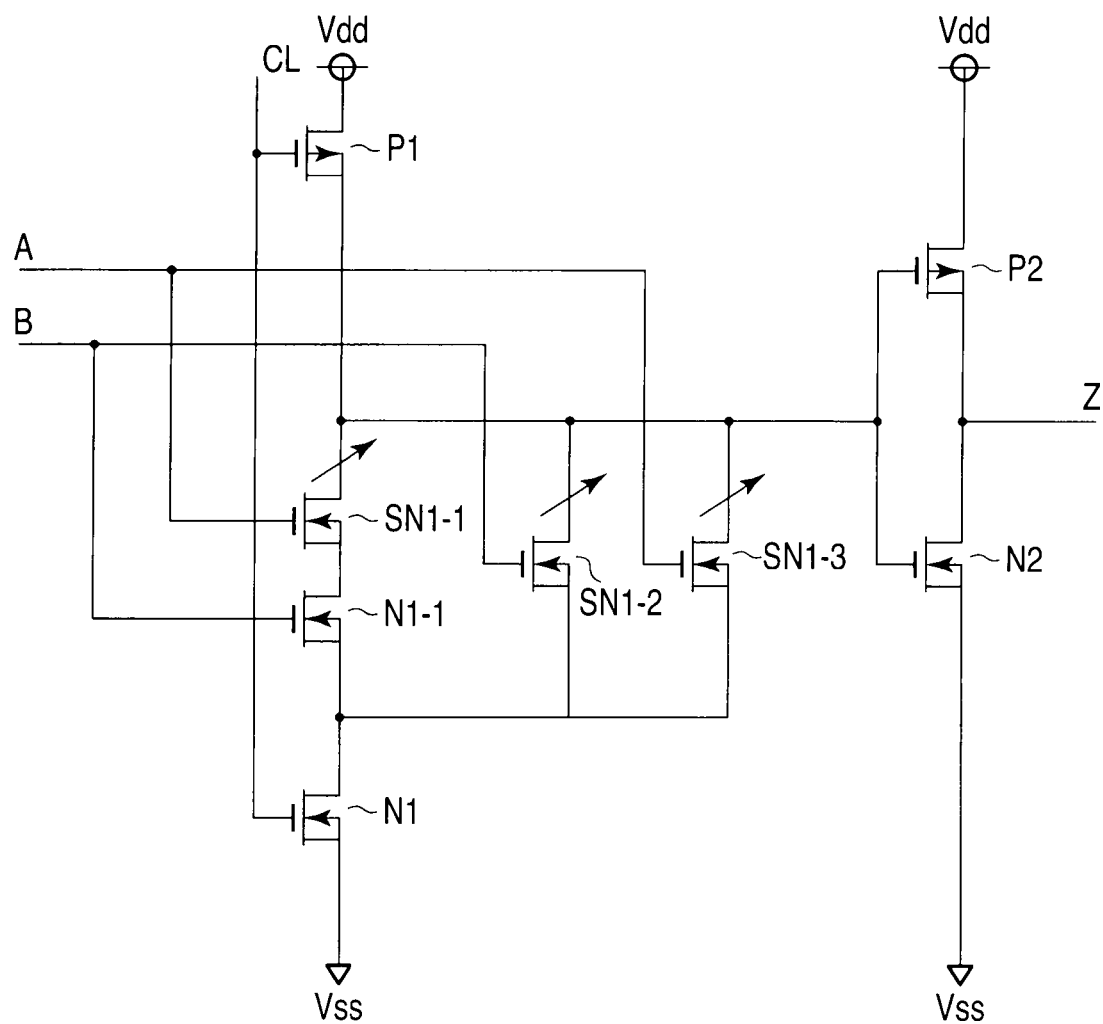
F I G. 20

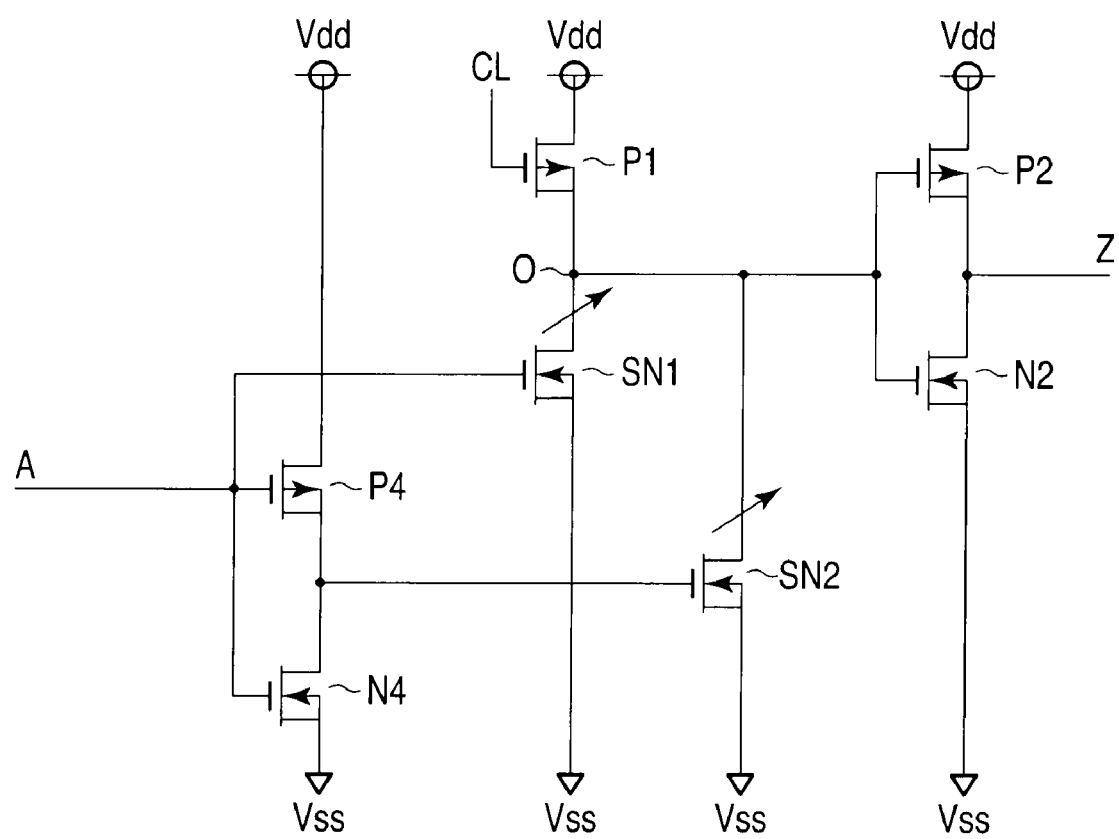
F I G. 21

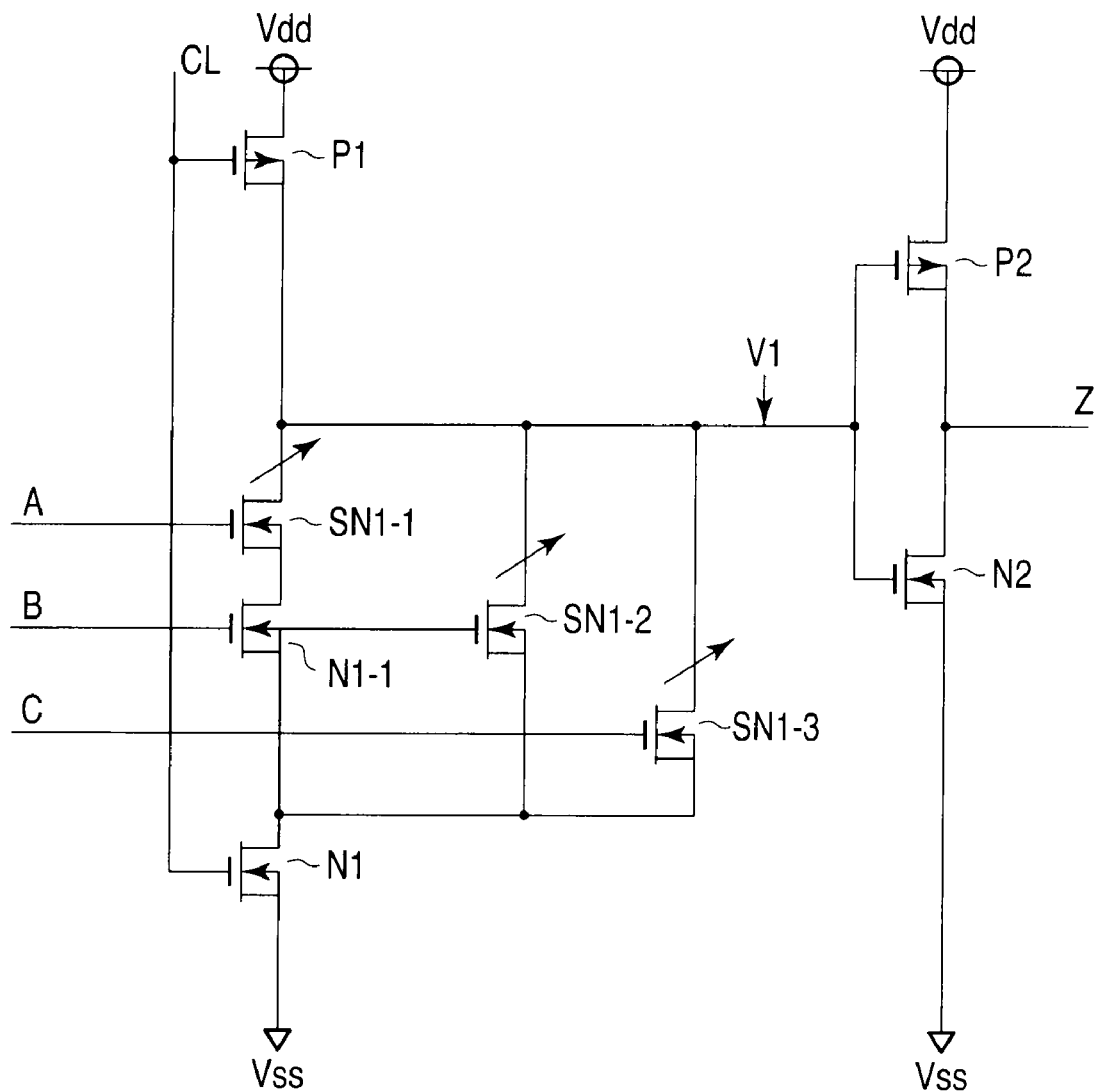
F I G. 22

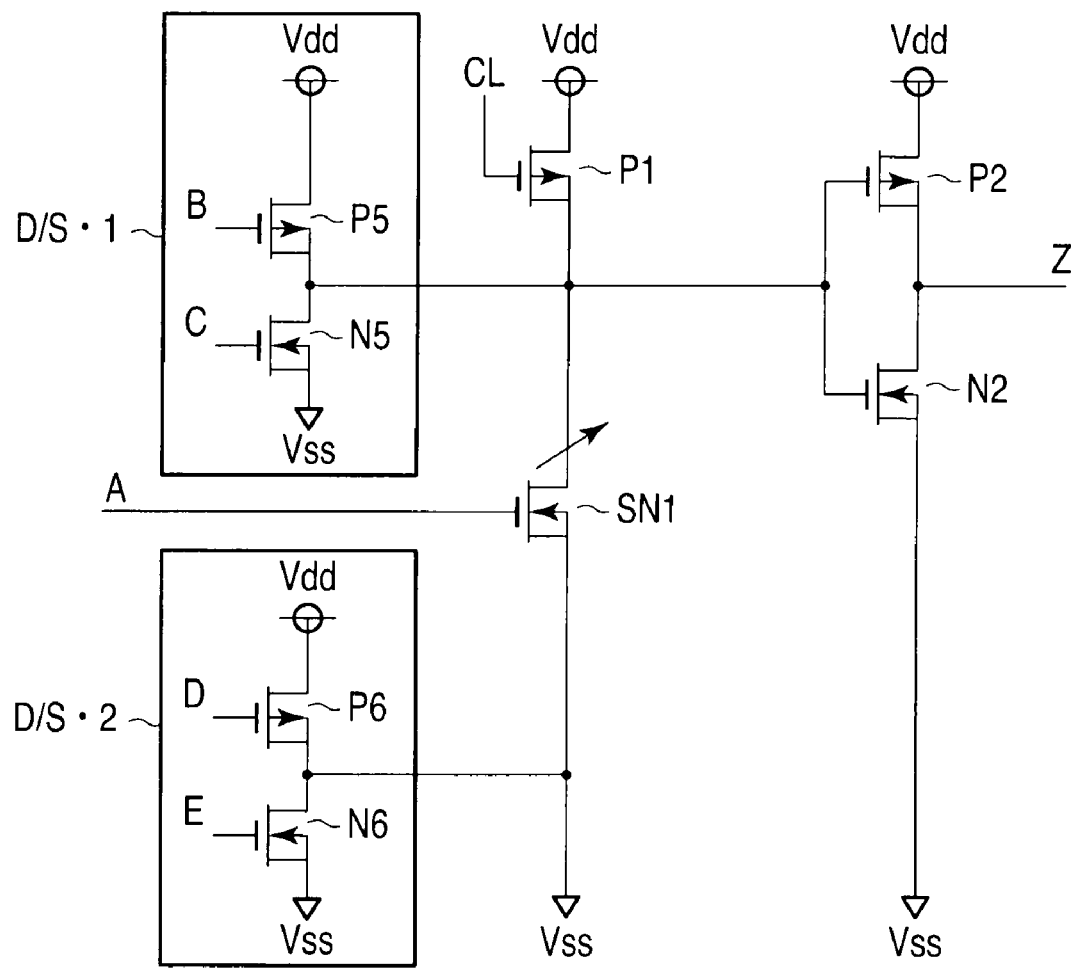
F I G. 23

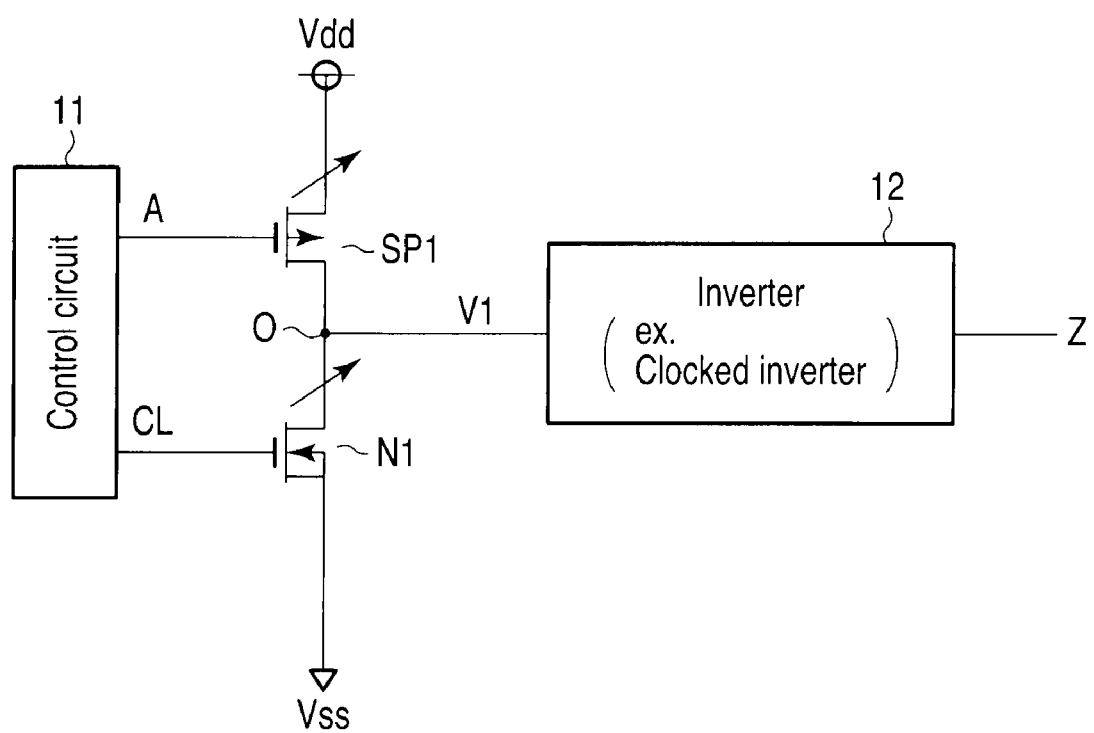
F I G. 25

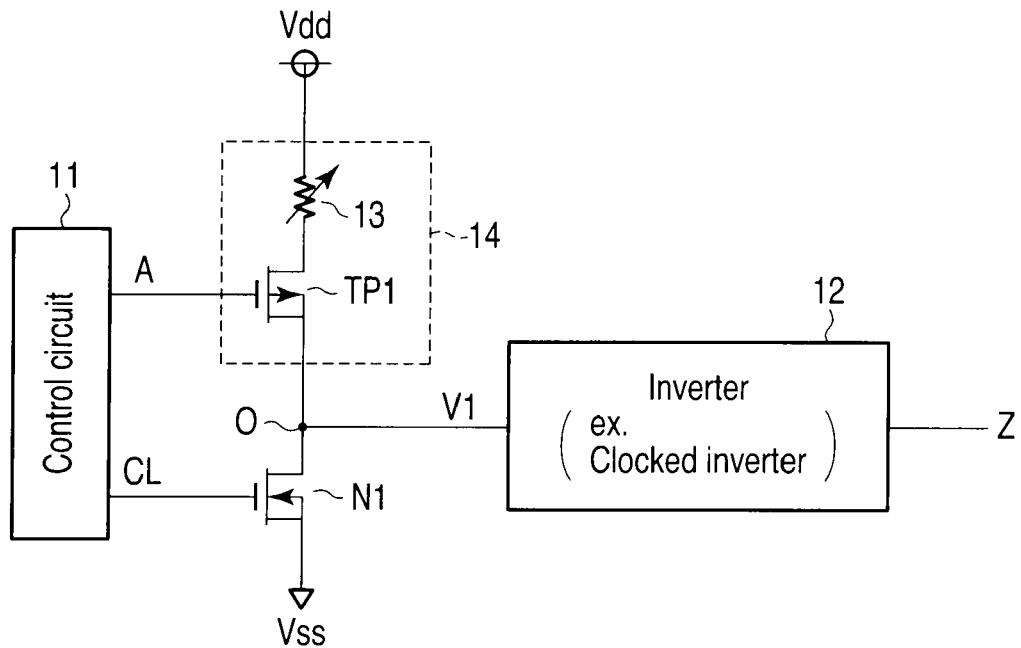
F I G. 28
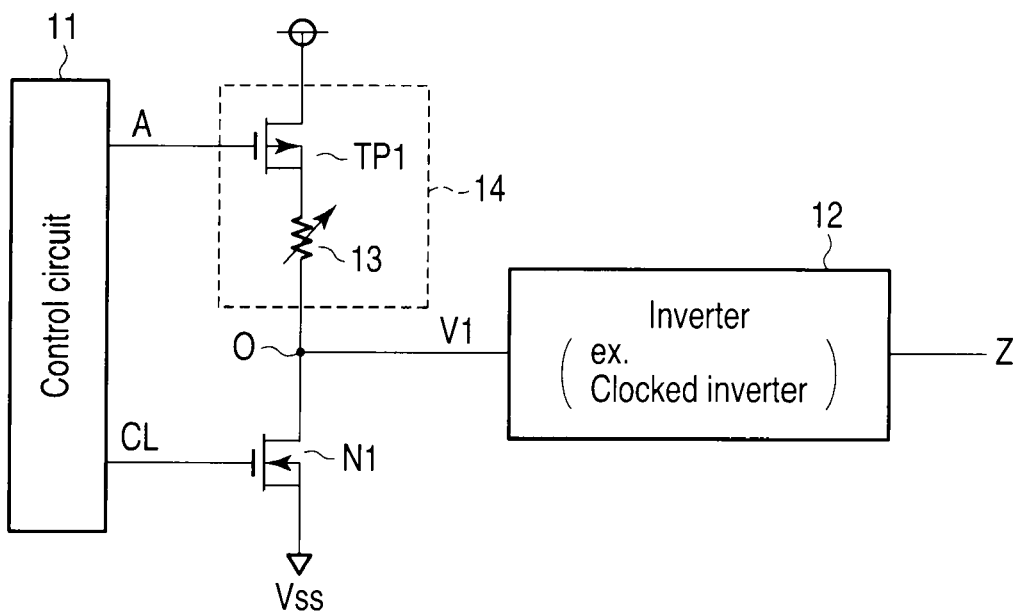
F I G. 29

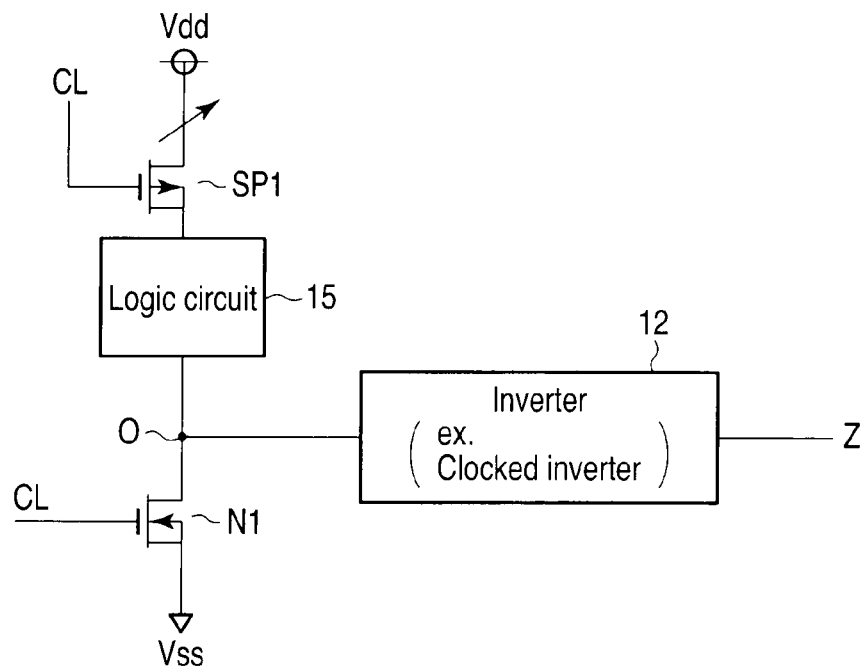
F I G. 30
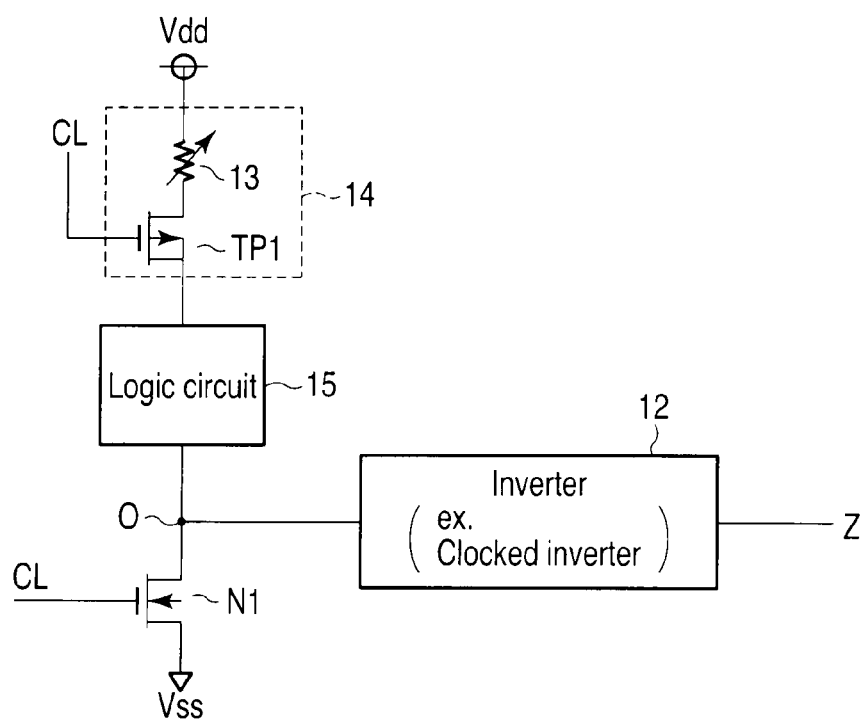
F I G. 31

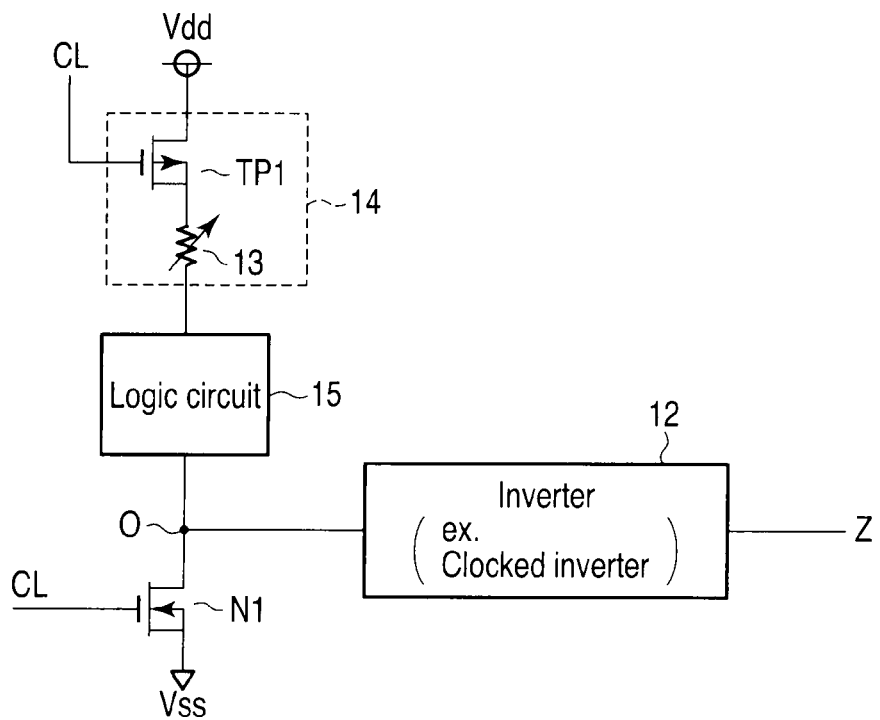
F I G. 32
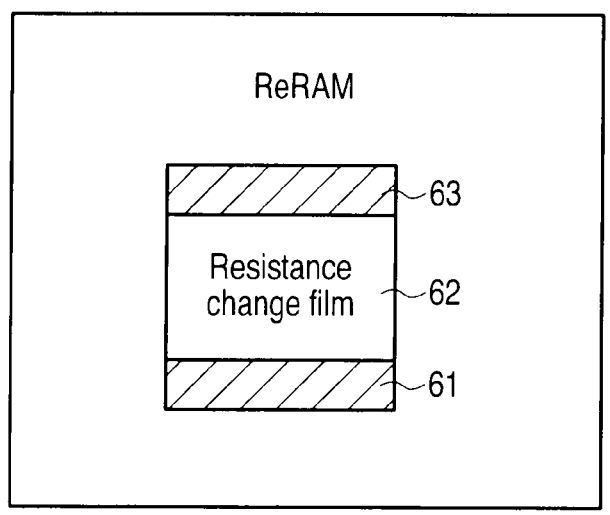
F I G. 33

US 8,111,087 B2

SEMICONDUCTOR INTEGRATED CIRCUIT

CROSS-REFERENCE TO RELATED APPLICATIONS

This application is based upon and claims the benefit of priority from prior Japanese Patent Application No. 2008-084937, filed Mar. 27, 2008, the entire contents of which are incorporated herein by reference.

BACKGROUND OF THE INVENTION

1. Field of the Invention

The present invention relates to a semiconductor integrated circuit capable of implementing a reconfigurable logic circuit.

2. Description of the Related Art

Recently, studies to implement new devices using the properties of electrons serving as charges and spins are being made extensively. One of such devices is a spin transistor. As a characteristic feature, it controls output characteristics based on the resistance value of a magnetic tunnel junction formed between the source terminal and the drain terminal (e.g., S. Sugahara and M. Tanaka, Appl. Phys. Lett. 84, 2307 (2004)).

It is possible to implement a reconfigurable logic circuit using the spin transistor (e.g., T. Matsuno, S. Sugahara, and M. Tanaka, Jpn. J. Appl. Phys. 43, 6032 (2004)).

A reconfigurable logic circuit using a spin transistor can nonvolatilely store data, unlike an SRAM (Static Random Access Memory). Hence, once programmed, it requires no reprogramming at the restart.

A spin transistor can perform high-speed rewrite and is therefore suitable for a reconfigurable logic circuit.

However, the conventional reconfigurable logic circuit using a spin transistor generates a large through current in a normal operation mode. This increases the power consumption of the logic circuit.

BRIEF SUMMARY OF THE INVENTION

A semiconductor integrated circuit according to an aspect of the present invention comprises an n-channel spin FET including one of a magnetic tunnel junction and a magneto-semiconductor junction which has one of a high resistance state and a low resistance state and which is located between a source terminal and a drain terminal, the n-channel spin FET including a gate terminal to receive an input signal, the source terminal to receive a first power supply potential, and the drain terminal connected to an output terminal; a p-channel FET including a gate terminal to receive a clock signal, a source terminal to receive a second power supply potential higher than the first power supply potential, and a drain terminal connected to the output terminal; a subsequent circuit including connected to the output terminal; and a control circuit which turns on the p-channel FET (P1) to start charging the output terminal, then turns off the p-channel FET to end the charging, and supplies the input signal to the gate terminal of the n-channel spin FET.

A semiconductor integrated circuit according to another aspect of the present invention comprises a series connection unit including a resistance change element which has one of a high resistance state and a low resistance state, and an n-channel FET including a gate terminal to receive an input signal connected in series, the series connection unit including one terminal to receive a first power supply potential, and the other terminal connected to an output terminal; a p-channel FET including a gate terminal to receive a clock signal, a source terminal to receive a second power supply potential higher than the first power supply potential, and a drain terminal connected to the output terminal; a subsequent circuit connected to the output terminal; and a control circuit which turns on the p-channel FET to start charging the output terminal, then turns off the p-channel FET to end the charging, and supplies the input signal to the gate terminal of the n-channel FET.

A semiconductor integrated circuit according to still another aspect of the present invention comprises an n-channel spin FET including one of a magnetic tunnel junction and a magneto-semiconductor junction which has one of a high resistance state and a low resistance state and which is located between a source terminal and a drain terminal, the n-channel spin FET including a gate terminal to receive a clock signal, and the source terminal to receive a first power supply potential; a p-channel FET including a gate terminal to receive the clock signal, a source terminal to receive a second power supply potential higher than the first power supply potential, and a drain terminal connected to an output terminal; a logic circuit which is connected between the output terminal and the drain terminal of the n-channel spin FET; and a subsequent circuit connected to the output terminal, wherein an output signal from the logic circuit is not output to the output terminal when the n-channel spin FET has the high resistance state, and the output signal from the logic circuit is output to the output terminal when the n-channel spin FET has the low resistance state.

A semiconductor integrated circuit according to still another aspect of the present invention comprises a series connection unit including a resistance change element which has one of a high resistance state and a low resistance state, and an n-channel FET including a gate terminal to receive a clock signal connected in series, the series connection unit including one terminal to receive a first power supply potential; a p-channel FET including a gate terminal to receive the clock signal, a source terminal to receive a second power supply potential higher than the first power supply potential, and a drain terminal connected to an output terminal; a logic circuit which is connected between the output terminal and the other terminal of the series connection unit; and a subsequent circuit connected to the output terminal, wherein an output signal from the logic circuit is not output to the output terminal when the resistance change element has the high resistance state, and the output signal from the logic circuit is output to the output terminal when the resistance change element has the low resistance state.

BRIEF DESCRIPTION OF THE SEVERAL VIEWS OF THE DRAWING

FIG. 2 shows an example of a spin FET;

FIG. 5 is a timing chart showing waveforms in the circuit examples of the first embodiment;

FIG. 6 is a timing chart showing waveforms in the circuit examples of the first embodiment;

FIG. 8 is a circuit diagram showing a semiconductor integrated circuit according to the second embodiment;

FIG. 9 is a circuit diagram showing another semiconductor integrated circuit according to the second embodiment;

FIG. 12 is a circuit diagram showing a semiconductor integrated circuit according to the third embodiment;

FIG. 13 is a circuit diagram showing a modification of the semiconductor integrated circuit in FIG. 12;

FIG. 14 is a circuit diagram showing a semiconductor integrated circuit according to the fourth embodiment;

FIG. 15 is a circuit diagram showing another semiconductor integrated circuit according to the fourth embodiment;

FIG. 18 is a circuit diagram showing a semiconductor integrated circuit as an application example;

FIG. 19 is a circuit diagram showing a semiconductor integrated circuit as an application example;

FIG. 20 is a circuit diagram showing a semiconductor integrated circuit as an application example;

FIG. 21 is a circuit diagram showing a semiconductor integrated circuit as an application example;

FIG. 22 is a circuit diagram showing a semiconductor integrated circuit as an application example;

FIG. 23 is a circuit diagram showing an example of a write circuit;

FIG. 25 is a circuit diagram showing the first example of a charge period control logic circuit;

FIG. 28 is a circuit diagram showing the second example of the charge period control logic circuit;

FIG. 29 is a circuit diagram showing the second example of the charge period control logic circuit;

FIG. 30 is a circuit diagram showing the third example of the charge period control logic circuit;

FIG. 31 is a circuit diagram showing the fourth example of the charge period control logic circuit;

FIG. 32 is a circuit diagram showing the fourth example of the charge period control logic circuit; and FIG. 33 is a view showing the basic structure of ReRAM.

DETAILED DESCRIPTION OF THE INVENTION

Figure 1:
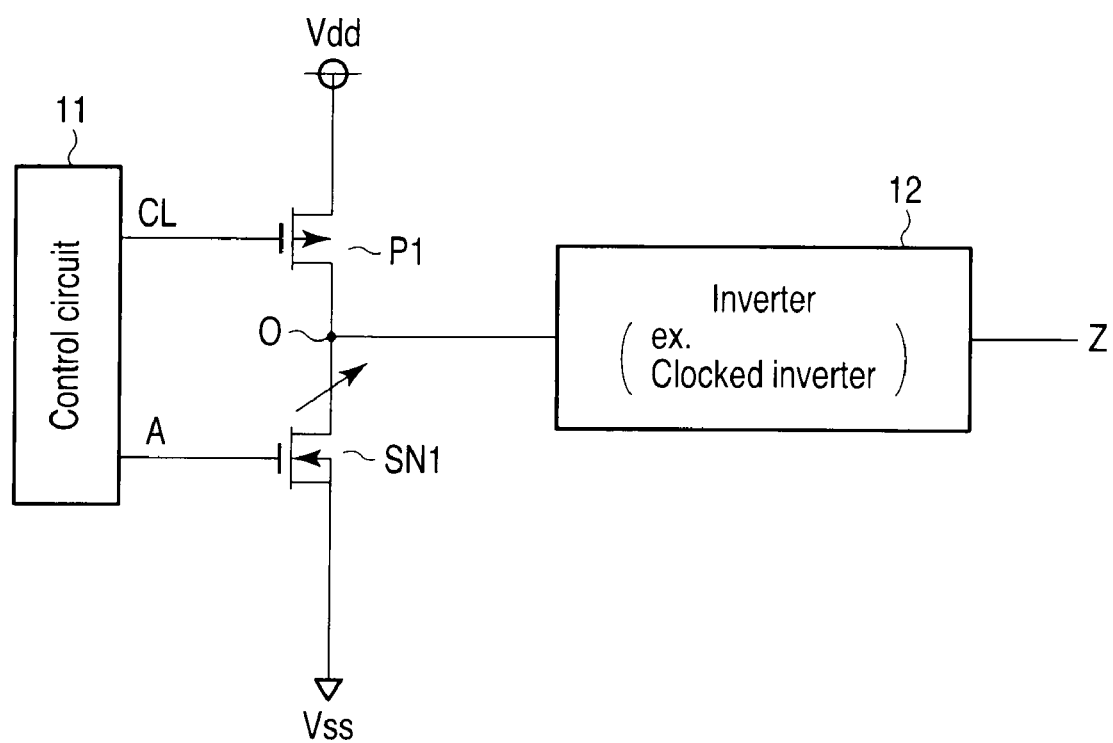
FIG. 1 is a circuit diagram showing a semiconductor integrated circuit according to the first embodiment.

A semiconductor integrated circuit of an aspect of the present invention will be described below in detail with reference to the accompanying drawing.

1. Outline

In the present invention, a reconfigurable logic circuit is formed using a spin FET (Field Effect Transistor) or a resistance change element capable of nonvolatilely storing data. Additionally, its operation timing is controlled to prevent a through current flowing between the first and second power supply potentials, thereby reducing power consumption.

A spin FET is an FET having, between the source terminal and the drain terminal, a magnetic tunnel junction or a magneto-semiconductor junction which takes one of a high resistance state and a low resistance state. The gate, source, and drain terminals indicate the gate, source, and drain electrodes of the spin FET.

A magneto-semiconductor junction indicates a junction formed by contact between a semiconductor and a magnetic substance. This junction mainly corresponds to a Schottky junction. A magneto-resistance effect is obtained by flowing a tunnel current via a Schottky junction.

A resistance change element is a variable resistance element which takes one of a high resistance state and a low resistance state.

First Basic Circuit

In the first basic circuit, a p-channel FET and an n-channel spin FET are connected in series between the first and second power supply potentials while sandwiching the output terminal. A clock signal is input to the gate terminal of the p-channel FET. An input signal is input to gate terminal of the n-channel spin FET.

The p-channel FET is turned on to start charging the output terminal. Then, the p-channel FET is turned off to end charging the output terminal. For example, the input signal is input when the p-channel FET is OFF.

This operation timing prevents the two transistors from being turned on simultaneously. It is therefore possible to prevent any through current flowing between the first and second power supply potentials and reduce power consumption.

The period from the end of output terminal charge to the restart of output terminal charge is set to be equal to a period in which the potential of the output terminal always has a value larger than the circuit threshold of a subsequent circuit (e.g., a logic circuit such as an inverter or a buffer) independently of the input signal when the magnetic tunnel junction or magneto-semiconductor junction is in the high resistance state. That is, when the magnetic tunnel junction or magneto-semiconductor junction is in the high resistance state, passage of the input signal is inhibited.

Additionally, the period from the end of output terminal charge to the restart of output terminal charge is set to be equal to a period in which the potential of the output terminal has a value larger or smaller than the circuit threshold of a subsequent circuit (e.g., a logic circuit such as an inverter or a buffer) depending on the input signal when the magnetic tunnel junction or magneto-semiconductor junction is in the low resistance state. That is, when the magnetic tunnel junction or magneto-semiconductor junction is in the low resistance state, passage of the input signal is permitted.

As described above, according to the first basic circuit, it is possible to implement a reconfigurable logic circuit which can reconfigure a function of permitting/inhibiting passage of the input signal in accordance with data written in the n-channel spin FET, and generates no through current in the normal operation mode.

Second Basic Circuit

In the second basic circuit, the n-channel spin FET of the first basic circuit is changed to a series connection unit including an n-channel FET and a resistance change element. A clock signal is input to the gate terminal of the p-channel FET. An input signal is input to gate terminal of the n-channel FET.

The p-channel FET is turned on to start charging the output terminal. Then, the p-channel FET is turned off to end charging the output terminal. For example, the input signal is input when the p-channel FET is OFF.

This operation timing prevents the two transistors from being turned on simultaneously. It is therefore possible to prevent any through current flowing between the first and second power supply potentials and reduce power consumption.

The period from the end of output terminal charge to the restart of output terminal charge is set to be equal to a period in which the potential of the output terminal always has a value larger than the circuit threshold of a subsequent circuit (e.g., a logic circuit such as an inverter or a buffer) independently of the input signal when the resistance change element is in the high resistance state. That is, when the resistance change element is in the high resistance state, passage of the input signal is inhibited.

Additionally, the period from the end of output terminal charge to the restart of output terminal charge is set to be equal to a period in which the potential of the output terminal has a value larger or smaller than the circuit threshold of a subsequent circuit (e.g., a logic circuit such as an inverter or a buffer) depending on the input signal when the resistance change element is in the low resistance state. That is, when the resistance change element is in the low resistance state, passage of the input signal is permitted.

As described above, according to the second basic circuit as well, it is possible to implement a reconfigurable logic circuit which can reconfigure a function of permitting/inhibiting passage of the input signal in accordance with data written in the resistance change element, and generates no through current in the normal operation mode.

Third Basic Circuit

In the third basic circuit, a p-channel FET and an n-channel spin FET are connected in series between the first and second power supply potentials while sandwiching the output terminal. A logic circuit is connected between the output terminal and the n-channel spin FET. A clock signal is input to the gate terminal of the p-channel FET and that of the n-channel spin FET.

In this case, when the clock signal changes to "L", the output terminal is charged. When the clock signal changes to "H", the output signal from the logic circuit is output to the output terminal in accordance with the state of the n-channel spin FET. More specifically, when the n-channel spin FET is in the high resistance state, output of the output signal from the logic circuit to the output terminal is inhibited. When the n-channel spin FET is in the low resistance state, output of the output signal from the logic circuit to the output terminal is permitted.

This operation timing prevents the p-channel FET and the n-channel spin FET from being turned on simultaneously. It is therefore possible to prevent any through current flowing between the first and second power supply potentials and reduce power consumption.

As described above, according to the third basic circuit, it is possible to implement a reconfigurable logic circuit which can reconfigure a function of permitting/inhibiting output of the output signal from the logic circuit in accordance with data written in the n-channel spin FET, and generates no through current in the normal operation mode.

Fourth Basic Circuit

In the fourth basic circuit, the n-channel spin FET of the third basic circuit is changed to a series connection unit including an n-channel FET and a resistance change element. A clock signal is input to the gate terminal of the p-channel FET and that of the n-channel FET.

In this case, when the clock signal changes to "L", the output terminal is charged. When the clock signal changes to "H", the output signal from the logic circuit is output to the output terminal in accordance with the state of the resistance change element. More specifically, when the resistance change element is in the high resistance state, output of the output signal from the logic circuit to the output terminal is inhibited. When the resistance change element is in the low resistance state, output of the output signal from the logic circuit to the output terminal is permitted.

This operation timing also prevents the p-channel FET and the n-channel FET from being turned on simultaneously. It is therefore possible to prevent any through current flowing between the first and second power supply potentials and reduce power consumption.

As described above, according to the fourth basic circuit, it is possible to implement a reconfigurable logic circuit which can reconfigure a function of permitting/inhibiting output of the output signal from the logic circuit in accordance with data written in the resistance change element, and generates no through current in the normal operation mode.

2. Embodiments (1) First Embodiment

The first embodiment is directed to the first basic circuit.

FIG. 1 shows a semiconductor integrated circuit according to the first embodiment.

An input signal A is input to the gate terminal of an n-channel spin FET SN1. A first power supply potential (e.g., ground potential) Vss is applied to the source terminal. An output terminal O is connected to the drain terminal.

A clock signal CL is input to the gate terminal of a p-channel MISFET (Metal-Insulator-Semiconductor Field Effect Transistor) P1. A second power supply potential (e.g., positive power supply potential) Vdd higher than the first power supply potential Vss is applied to the source terminal. The output terminal O is connected to the drain terminal.

A control circuit 11 outputs the clock signal CL and the input signal A.

The control circuit 11 includes any components (e.g., a logic circuit or a transfer gate of the preceding stage) which output the clock signal CL and the input signal A at the following operation timing.

The control circuit 11 sets the clock signal CL to "L" to turn on the p-channel MISFET P1 and start charging the output terminal O. After that, the control circuit 11 sets the clock signal CL to "H" to turn off the p-channel MISFET P1 and end charging the output terminal O. Then, the control circuit 11 supplies the input signal A to the gate terminal of the n-channel spin FET SN1.

The input terminal of an inverter 12 of the subsequent stage is connected to the output terminal O. The inverter 12 is, e.g., a clocked inverter.

The n-channel spin FET SN1 has, between the source terminal and the drain terminal, a magnetic tunnel junction or a magneto-semiconductor junction which takes one of a high resistance state and a low resistance state.

The high resistance state of the magnetic tunnel junction or magneto-semiconductor junction yields a resistance value at which the potential of the output terminal O always has a value larger than the circuit threshold of the inverter 12 of the subsequent stage independently of the input signal A. That is, when the magnetic tunnel junction or magneto-semiconductor junction is in the high resistance state, passage of the input signal is inhibited.

The low resistance state of the magnetic tunnel junction or magneto-semiconductor junction yields a resistance value at which the potential of the output terminal O has a value larger or smaller than the circuit threshold of the inverter 12 of the subsequent stage depending on the input signal A. That is, when the magnetic tunnel junction or magneto-semiconductor junction is in the low resistance state, passage of the input signal is permitted.

FIG. 2 shows examples of a spin FET having a magnetic tunnel junction.

A spin FET shown in FIG. 2(a) has n-type source/drain diffusion layers 2A and 2B in a p-type semiconductor substrate 1. A gate insulating film 3 is formed on the channel region between the n-type source/drain diffusion layers 2A and 2B. A gate electrode (gate terminal G) 4 is formed on the gate insulating film 3.

Tunnel barrier films 5A and 5B are formed on the n-type source/drain diffusion layers 2A and 2B, respectively. Ferromagnetic films 6A and 6B are formed on the tunnel barrier films 5A and 5B, respectively. The ferromagnetic films 6A and 6B are connected to source/drain electrodes (source/drain terminals) S/D.

One of the ferromagnetic films 6A and 6B serves as a magnetization fixed layer (pinned layer) in which the magnetization direction is fixed, and the other serves as a magnetization recording layer (free layer) in which the magnetization direction changes. One of the tunnel barrier films 5A and 5B may be omitted.

Alternatively, both the tunnel barrier films 5A and 5B may be omitted. In this case, the spin FET has a magneto-semiconductor junction.

The magnetization directions of the ferromagnetic films 6A and 6B can be either parallel (in-plane magnetization) or perpendicular (perpendicular magnetization) to their film surfaces.

The resistance value of the magnetic tunnel junction of the spin FET is determined by the relative magnetization directions of the ferromagnetic films 6A and 6B.

A spin FET shown in FIG. 2(b) has the n-type source/drain diffusion layers 2A and 2B in the p-type semiconductor substrate 1. The gate insulating film 3 is formed on the channel region between the n-type source/drain diffusion layers 2A and 2B. The gate electrode (gate terminal G) 4 is formed on the gate insulating film 3.

A stacked film including the ferromagnetic film 6A, a tunnel barrier film 5, and the ferromagnetic film 6B is formed on the n-type source/drain diffusion layer 2B. The n-type source/drain diffusion layer 2A and the ferromagnetic film 6B are connected to the source/drain electrodes (source/drain terminals) S/D.

One of the ferromagnetic films 6A and 6B serves as a magnetization fixed layer (pinned layer) in which the magnetization direction is fixed, and the other serves as a magnetization recording layer (free layer) in which the magnetization direction changes. The tunnel barrier film 5 may be omitted. In this case, the spin FET has a magneto-semiconductor junction.

The magnetization directions of the ferromagnetic films 6A and 6B can be either parallel (in-plane magnetization) or perpendicular (perpendicular magnetization) to their film surfaces.

The resistance value of the magnetic tunnel junction of the spin FET is determined by the relative magnetization directions of the ferromagnetic films 6A and 6B.

A spin FET shown in FIG. 2(c) has no n-type source/drain diffusion layers, unlike the spin FETs shown in FIG. 2(a) and FIG. 2(b).

Concave portions are formed in the surface region of the p-type semiconductor substrate 1. The tunnel barrier films 5A and 5B and the ferromagnetic films 6A and 6B are formed in the concave portions. The gate insulating film 3 is formed on the channel region between the ferromagnetic films 6A and 6B. The gate electrode (gate terminal G) 4 is formed on the gate insulating film 3. The ferromagnetic films 6A and 6B are connected to the source/drain electrodes (source/drain terminals) S/D.

One of the ferromagnetic films 6A and 6B serves as a magnetization fixed layer (pinned layer) in which the magnetization direction is fixed, and the other serves as a magnetization recording layer (free layer) in which the magnetization direction changes. One of the tunnel barrier films 5A and 5B may be omitted.

Alternatively, both the tunnel barrier films 5A and 5B may be omitted. In this case, the spin FET has a magneto-semiconductor junction.

The magnetization directions of the ferromagnetic films 6A and 6B can be either parallel (in-plane magnetization) or perpendicular (perpendicular magnetization) to their film surfaces.

The resistance value of the magnetic tunnel junction of the spin FET is determined by the relative magnetization directions of the ferromagnetic films 6A and 6B.

Figure 3:
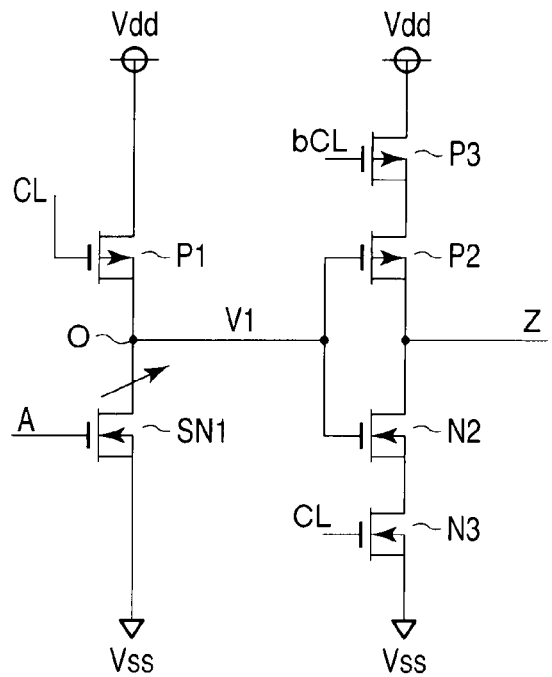
FIG. 3 is a circuit diagram showing a circuit example of the first embodiment.
Figure 4:
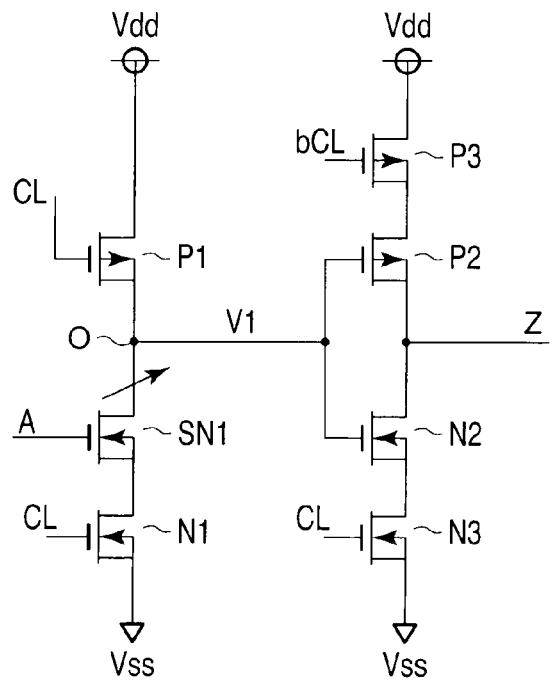
FIG. 4 is a circuit diagram showing another circuit example of the first embodiment.

FIGS. 3 and 4 show circuit examples of the first embodiment.

These circuit examples use a clocked inverter as the inverter 12 in FIG. 1. The control circuit is not illustrated.

The clocked inverter includes p-channel MISFETs P2 and P3 and n-channel MISFETs N2 and N3, which are connected in series.

The output terminal O is connected to the gate terminals (input terminals) of the p-channel MISFET P2 and the n-channel MISFET N2 which receive V1. The clock signal CL is input to the gate terminal of the n-channel MISFET N3. An inverted signal bCL of the clock signal CL is input to the gate terminal of the p-channel MISFET P3.

Unlike the circuit example in FIG. 3, the circuit example in FIG. 4 also includes an n-channel MISFET N1 connected to the source terminal of the n-channel spin FET SN1. The clock signal CL is input to the gate terminal of the n-channel MISFET N1.

FIG. 5 shows operation waveforms in the circuit examples shown in FIGS. 3 and 4 when the n-channel spin FET SN1 is in the low resistance state.

When the clock signal CL is "L (=0)", the p-channel MISFET P3 and the n-channel MISFET N3 are OFF, and the clocked inverter is inoperative. The p-channel MISFET P1 is ON so that the output terminal O is charged to set V1 to "H (=1)". At this time, the input signal A is not input ("L"). In the circuit example shown in FIG. 4, since the n-channel MISFET N1 is OFF, no through current is generated.

When the clock signal CL changes from "L" to "H", the p-channel MISFET P1 is turned off to end charging the output terminal O. The clocked inverter becomes operative. In the example shown in FIG. 4, the n-channel MISFET N1 is turned on. For this reason, when the input signal A is input in the "H" state of the clock signal CL, the value of V1 is determined in accordance with the value of the input signal A.

For example, as shown in FIG. 5, when the input signal A is "H", charges in the output terminal O are rapidly removed to the first power supply potential Vss via the n-channel spin FET SN1. Hence, V1 changes from "H" to "L". On the other hand, when the input signal A is "L", V1 remains "H".

As described above, when the n-channel spin FET SN1 is in the low resistance state, and the input signal A is "H", an output signal Z from the clocked inverter is "H". When the input signal A is "L", the output signal Z from the clocked inverter is "L".

Note that when the clock signal CL is "L", the output signal Z from the clocked inverter continuously holds the immediately preceding state when CL="H" without being affected by the value of V1.

FIG. 6 shows operation waveforms in the circuit examples shown in FIGS. 3 and 4 when the n-channel spin FET SN1 is in the high resistance state.

When the clock signal CL is "L (=0)", the p-channel MISFET P3 and the n-channel MISFET N3 are OFF, and the clocked inverter is inoperative. The p-channel MISFET P1 is ON so that the output terminal O is charged to set V1 to "H (=1)". At this time, the input signal A is not input ("L"). In the circuit example shown in FIG. 4, since the n-channel MISFET N1 is OFF, no through current is generated.

When the clock signal CL changes from "L" to "H", the p-channel MISFET P1 is turned off to end charging the output terminal O. The clocked inverter becomes operative. In the example shown in FIG. 4, the n-channel MISFET N1 is turned on. However, when the n-channel spin FET SN1 is in the high resistance state, is even when the input signal A is input in the "H" state of the clock signal CL, the value of V1 does not change in accordance with the value of the input signal A.

More specifically, when the input signal A is "H", the n-channel spin FET SN1 is turned on. Its ON resistance (the resistance value between the source terminal and the drain terminal) is very high. For this reason, the speed of moving charges from the output terminal O to the first power supply potential Vss via the n-channel spin FET SN1 decreases. When the period of the clock signal CL is set such that the clock signal CL returns from "H" to "L" before the potential of V1 becomes less than the circuit threshold of the clocked inverter of the subsequent stage, V1 remains "H" independently of the input signal A.

As described above, when the n-channel spin FET SN1 is in the high resistance state, the output signal Z from the clocked inverter is always "L" so that passage of the input signal A is inhibited.

Table 1 is the truth table of the circuit examples in FIGS. 3 and 4.

TABLE 1

Truth table

| State of spin FET SN1 | A | CL | V1 | Z |
|---|---|---|---|---|
| Parallel (low resistance) | 1 | 1 | 0 | 1 |
|  | 0 | 1 | 1 | 0 |
| Antiparallel (high resistance) | 0/1 | 1 | 1 | 0 |

The timing of inputting the input signal A is as follows. For example, in the circuit example shown in FIG. 3, the input signal A is supplied to the gate terminal of the n-channel spin FET SN1 in the OFF state of the p-channel MISFET P1 (after charge), thereby preventing the through current generated upon charge.

For example, in the circuit example shown in FIG. 4, when the p-channel MISFET P1 is ON (during charge), the n-channel MISFET N1 is always OFF to prevent the through current. Hence, the input signal A is supplied to the gate terminal of the n-channel spin FET SN1 after the p-channel MISFET P1 is turned on to start charge.

As described above, according to the first embodiment, it is possible to implement a reconfigurable logic circuit which can reconfigure a function of permitting/inhibiting passage of the input signal in accordance with data written in the n-channel spin FET, and generates no through current in the normal operation mode.

The magnetization state of the n-channel spin FET is nonvolatilely held even after power-off. Hence, the circuit can perform the same operation when powered on again.

Figure 7:
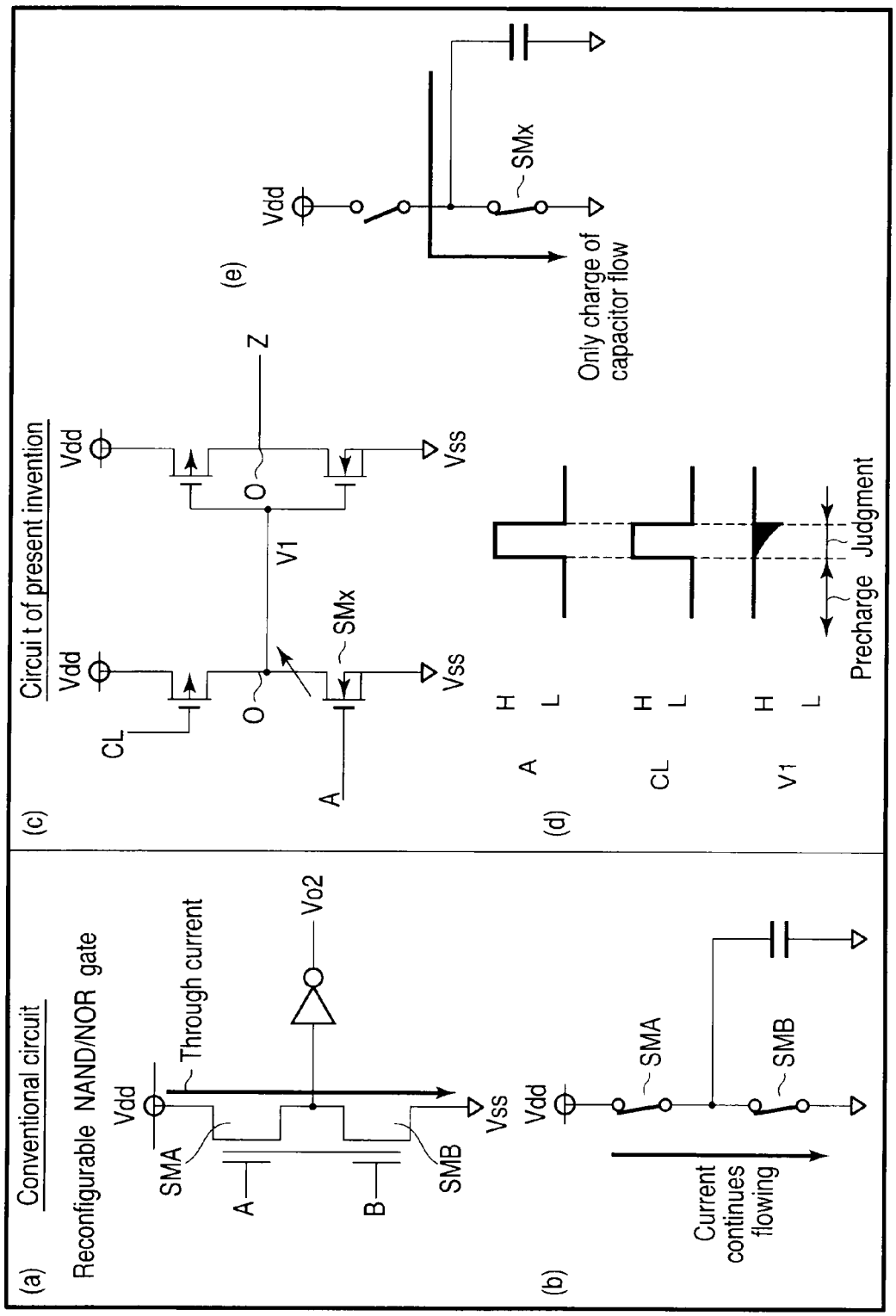
FIG. 7 shows a comparison between a conventional circuit and a circuit of the present invention.

FIG. 7 shows the power consumption reducing effect obtained by preventing the through current.

As shown in FIGS. 7(a) and 7(b), a conventional reconfigurable logic circuit generates a through current when implementing a logic. In the present invention, however, a precharge period and a judgment period exist, and only charges accumulated in the output node V1 by precharge are removed, as shown in FIG. 7(c), FIG. 7(d) and FIG. 7(e).

The reconfigurable logic circuit having the new arrangement can reduce power consumption by preventing the through current.

(2) Second Embodiment

The second embodiment is directed to the second basic circuit.

The second embodiment is largely different from the first embodiment in that a series connection unit including an n-channel MISFET and a resistance change element is connected between the first power supply potential and the output terminal in place of an n-channel spin FET.

FIGS. 8 and 9 show semiconductor integrated circuits according to the second embodiment.

A series connection unit 14 includes an n-channel MISFET TN1 and a resistance change element 13. A first power supply potential (e.g., ground potential) Vss is applied to one terminal of the series connection unit 14. An output terminal O is connected to the other terminal.

An input signal A is input to the gate terminal of the n-channel MISFET TN1.

As the resistance change element 13, for example, a magnetoresistive element which changes the resistance value changes in accordance with the relative magnetization directions of a magnetization recording layer and a magnetization fixed layer, a resistance change element which changes the resistance value upon voltage application, or a phase-change element which changes the resistance value in accordance with a phase change is used.

An example of the magnetoresistive element is a TMR (Tunnel Magneto-Resistance) element which uses a TMR effect. The resistance change element which changes the resistance value upon voltage application changes the resistance value by moving ions such as Ag ions or using an oxide such as $Cr_2O_3$.

A phase-change element can be formed using a phase-change material which has, e.g., a low resistance value in a crystalline state and a high resistance value in an amorphous state. For example, binary, ternary, and quaternary phase-change chalcogenides are usable. Detailed examples are germanium-antimony (Ge—Sb), germanium-antimony-tellurium (Ge—Sb—Te), and tin-indium-antimony-tellurium (Sn—In—Sb—Te). A write operation will be described. To change the phase-change material of a phase-change memory cell to an amorphous state, a write pulse is applied to heat the phase-change material at an amorphization temperature. Then, the material is rapidly cooled and actually transformed into an amorphous state. On the other hand, to change the phase-change material to a crystalline state, a write pulse for reducing the speed of cooling the phase-change material is applied to actually transform it into a crystalline state. The width and magnitude of the write pulse are appropriately selected.

As for the positional relationship between the n-channel MISFET TN1 and the resistance change element 13, the n-channel MISFET TN1 may be arranged on the side of the output terminal O, as shown in FIG. 8. Alternatively, the resistance change element 13 may be arranged on the side of the output terminal O, as shown in FIG. 9.

The example in FIG. 9 is more preferable than that in FIG. 8 from the viewpoint of the driving force of the n-channel MISFET TN1.

A clock signal CL is input to the gate terminal of a p-channel MISFET P1. A second power supply potential (e.g., positive power supply potential) Vdd higher than the first power supply potential Vss is applied to the source terminal. The output terminal O is connected to the drain terminal.

A control circuit 11 outputs the clock signal CL and the input signal A.

The control circuit 11 includes any components (e.g., a logic circuit or a transfer gate of the preceding stage) which output the clock signal CL and the input signal A at the following operation timing, as in the first embodiment.

The control circuit 11 sets the clock signal CL to "L" to turn on the p-channel MISFET P1 and start charging the output terminal O. After that, the control circuit 11 sets the clock signal CL to "H" to turn off the p-channel MISFET P1 and end charging the output terminal O. Then, the control circuit 11 supplies the input signal A to the gate terminal of the n-channel MISFET TN1.

The input terminal of an inverter 12 of the subsequent stage is connected to the output terminal O. The inverter 12 is, e.g., a clocked inverter.

The resistance change element 13 takes one of a high resistance state and a low resistance state.

The high resistance state yields a resistance value at which the potential of the output terminal O always has a value larger than the circuit threshold of the inverter 12 of the subsequent stage independently of the input signal A. That is, passage of the input signal is inhibited in the high resistance state.

The low resistance state yields a resistance value at which the potential of the output terminal O has a value larger or smaller than the circuit threshold of the inverter 12 of the subsequent stage depending on the input signal A. That is, passage of the input signal is permitted in the low resistance state.

Figure 10:
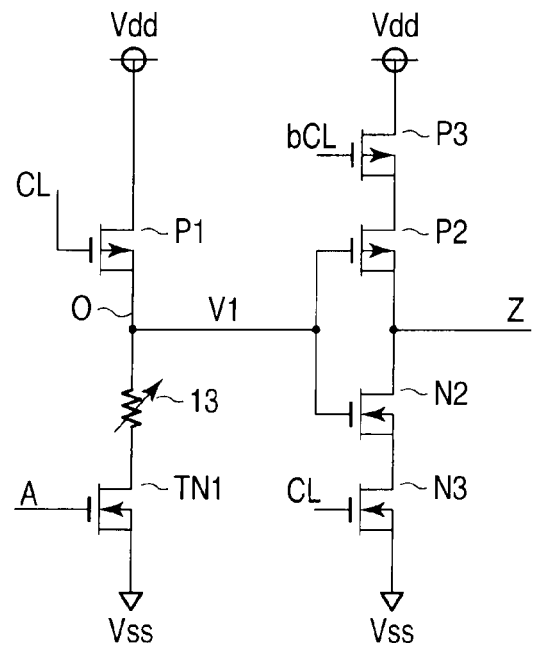
FIG. 10 is a circuit diagram showing a circuit example of the second embodiment.
Figure 11:
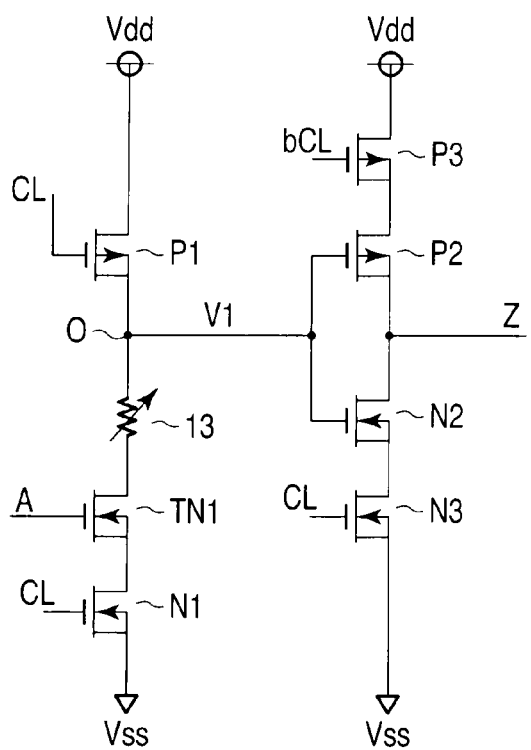
FIG. 11 is a circuit diagram showing another circuit example of the second embodiment.

FIGS. 10 and 11 show circuit examples of the second embodiment.

These circuit examples use a clocked inverter as the inverter 12 in FIG. 9. The control circuit is not illustrated.

The clocked inverter includes p-channel MISFETs P2 and P3 and n-channel MISFETs N2 and N3, which are connected in series.

The output terminal O is connected to the gate terminals (input terminals) of the p-channel MISFET P2 and the n-channel MISFET N2 which receive V1. The clock signal CL is input to the gate terminal of the n-channel MISFET N3. An inverted signal bCL of the clock signal CL is input to the gate terminal of the p-channel MISFET P3.

Unlike the circuit example in FIG. 10, the circuit example in FIG. 11 also includes an n-channel MISFET N1 connected to the source terminal of the n-channel MISFET TN1. The clock signal CL is input to the gate terminal of the n-channel MISFET N1.

The operation timings of the circuit examples shown in FIGS. 10 and 11 are the same as in the first embodiment (FIGS. 5 and 6), and a description thereof will not be repeated.

Table 2 is the truth table of the circuit examples in FIGS. 10 and 11.

TABLE 2

| Truth table | | | | |
|---|---|---|---|---|
| State of resistance change element | A | CL | V1 | Z |
| Parallel (low resistance) | 1 | 1 | 0 | 1 |
|  | 0 | 1 | 1 | 0 |
| Antiparallel (high resistance) | 0/1 | 1 | 1 | 0 |

The timing of inputting the input signal A is as follows. For example, in the circuit example shown in FIG. 10, the input signal A is supplied to the gate terminal of the n-channel MISFET TN1 in the OFF state of the p-channel MISFET P1 (after charge), thereby preventing the through current generated upon charge.

For example, in the circuit example shown in FIG. 11, when the p-channel MISFET P1 is ON (during charge), the n-channel MISFET N1 is always OFF to prevent the through current. Hence, the input signal A is supplied to the gate terminal of the n-channel MISFET TN1 after the p-channel MISFET P1 is turned on to start charge.

As described above, according to the second embodiment, it is possible to implement a reconfigurable logic circuit which can reconfigure a function of permitting/inhibiting passage of the input signal in accordance with data written in the resistance change element, and generates no through current in the normal operation mode.

The state of the resistance change element is nonvolatilely held even after power-off. Hence, the circuit can perform the same operation when powered on again.

(3) Third Embodiment

The third embodiment is directed to the third basic circuit.

FIG. 12 shows a semiconductor integrated circuit according to the third embodiment.

A clock signal CL is input to the gate terminal of an n-channel spin FET SN1. A first power supply potential (e.g., ground potential) Vss is applied to the source terminal.

The clock signal CL is input to the gate terminal of a p-channel MISFET P1. A second power supply potential (e.g., positive power supply potential) Vdd higher than the first power supply potential Vss is applied to the source terminal. The output terminal O is connected to the drain terminal.

A logic circuit 15 is connected between the output terminal O and the drain terminal of the n-channel spin FET SN1.

The input terminal of an inverter 12 of the subsequent stage is connected to the output terminal O. The inverter 12 is, e.g., a clocked inverter.

The n-channel spin FET SN1 has, between the source terminal and the drain terminal, a magnetic tunnel junction or a magneto-semiconductor junction which takes one of a high resistance state and a low resistance state.

The high resistance state of the magnetic tunnel junction or magneto-semiconductor junction yields a resistance value at which the output signal from the logic circuit 15 is not output to the output terminal O. That is, when the magnetic tunnel junction or magneto-semiconductor junction is in the high resistance state, output of the output signal from the logic circuit 15 is inhibited.

The low resistance state of the magnetic tunnel junction or magneto-semiconductor junction yields a resistance value at which the output signal from the logic circuit 15 is output to the output terminal O. That is, when the magnetic tunnel junction or magneto-semiconductor junction is in the low resistance state, output from the logic circuit 15 is permitted.

FIG. 13 shows a modification of the semiconductor integrated circuit in FIG. 12.

In this modification, three n-channel spin FETs SN1A, SN1B, and SN1C are connected in parallel between the first power supply potential Vss and the output terminal O. The clock signal CL is commonly input to the gate terminals of the n-channel spin FETs SN1A, SN1B, and SN1C. The first power supply potential Vss is applied to their source terminals.

A logic circuit 15A is connected between the n-channel spin FET SN1A and the output terminal O. A logic circuit 15B is connected between the n-channel spin FET SN1B and the output terminal O. A logic circuit 15C is connected between the n-channel spin FET SN1C and the output terminal O.

In this case, when the n-channel spin FET SN1A is in the low resistance state, the output signal from the logic circuit 15A is output to the output terminal O. When the n-channel spin FET SN1B is in the low resistance state, the output signal from the logic circuit 15B is output to the output terminal O. When the n-channel spin FET SN1CB is in the low resistance state, the output signal from the logic circuit 15C is output to the output terminal O.

Hence, when one of the n-channel spin FETs SN1A, SN1B, and SN1C is set in the low resistance state, and the remaining n-channel spin FETs are set in the high resistance state, the output signal from the logic circuit connected in series to the n-channel spin FET in the low resistance state is selectively output.

That is, if the logic circuits 15A, 15B, and 15C have different logics, one of the three logics can selectively be output.

This modification includes three logic circuits. However, the present invention is not limited to this. The function of switching different logics can be implemented using two or more logic circuits.

As described above, according to the third embodiment, it is possible to implement a reconfigurable logic circuit which can reconfigure a function of permitting/inhibiting output of the output signal from the logic circuit in accordance with data written in the n-channel spin FET, and generates no through current in the normal operation mode.

The magnetization state of the n-channel spin FET is nonvolatilely held even after power-off. Hence, the circuit can perform the same operation when powered on again.

(4) Fourth Embodiment

The fourth embodiment is directed to the fourth basic circuit.

The fourth embodiment is largely different from the third embodiment in that a series connection unit including an n-channel MISFET and a resistance change element is connected between the first power supply potential and the output terminal in place of an n-channel spin FET.

FIGS. 14 and 15 show semiconductor integrated circuits according to the fourth embodiment.

A series connection unit 14 includes an n-channel MISFET TN1 and a resistance change element 13. A first power supply potential (e.g., ground potential) Vss is applied to one terminal of the series connection unit 14. An output terminal O is connected to the other terminal.

A clock signal CL is input to the gate terminal of the n-channel MISFET TN1.

As the resistance change element 13, for example, a magnetoresistive element which changes the resistance value changes in accordance with the relative magnetization directions of a magnetization recording layer and a magnetization fixed layer, a resistance change element which changes the resistance value upon voltage application, or a phase-change element which changes the resistance value in accordance with a phase change is used.

As for the positional relationship between the n-channel MISFET TN1 and the resistance change element 13, the n-channel MISFET TN1 may be arranged on the side of the output terminal O, as shown in FIG. 14. Alternatively, the resistance change element 13 may be arranged on the side of the output terminal O, as shown in FIG. 15.

The example in FIG. 15 is more preferable than that in FIG. 14 from the viewpoint of the driving force of the n-channel MISFET TN1.

The clock signal CL is input to the gate terminal of a p-channel MISFET P1. A second power supply potential (e.g., positive power supply potential) Vdd higher than the first power supply potential Vss is applied to the source terminal. The output terminal O is connected to the drain terminal.

The input terminal of an inverter 12 of the subsequent stage is connected to the output terminal O. The inverter 12 is, e.g., a clocked inverter.

The resistance change element 13 takes one of a high resistance state and a low resistance state.

The high resistance state yields a resistance value at which the output signal from a logic circuit 15 is not output to the output terminal O. That is, output of the output signal from the logic circuit 15 is inhibited in the high resistance state.

The low resistance state yields a resistance value at which the output signal from the logic circuit 15 is output to the output terminal O. That is, output of the output signal from the logic circuit 15 is permitted in the low resistance state.

Figure 16:
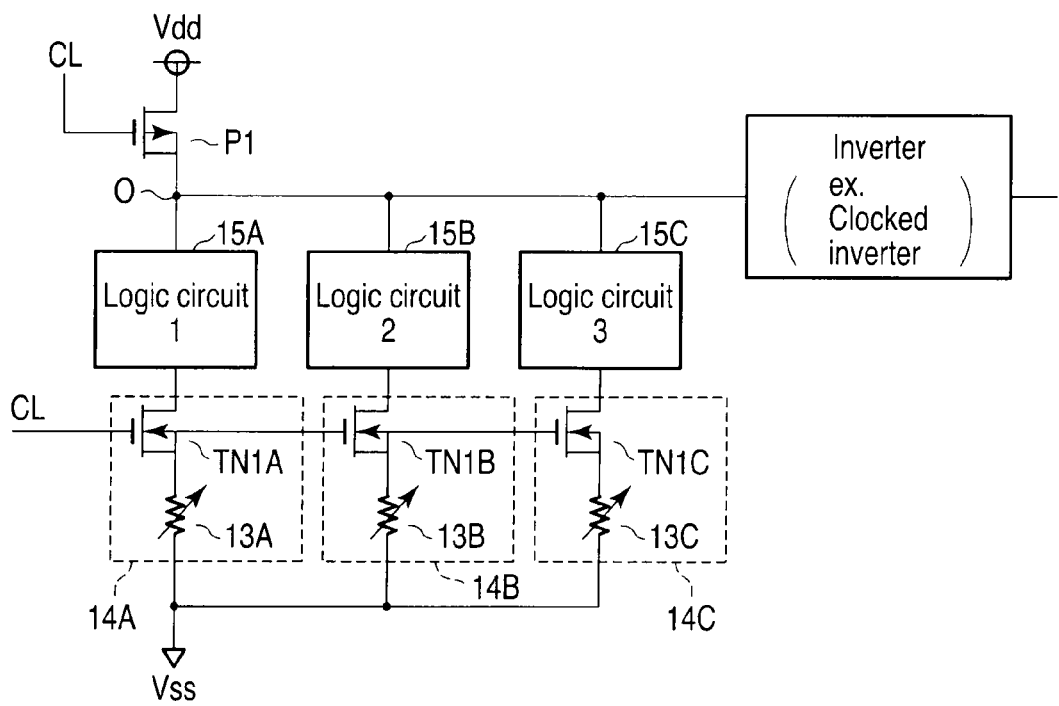
FIG. 16 is a circuit diagram showing a modification of the semiconductor integrated circuit in FIG. 14.
Figure 17:
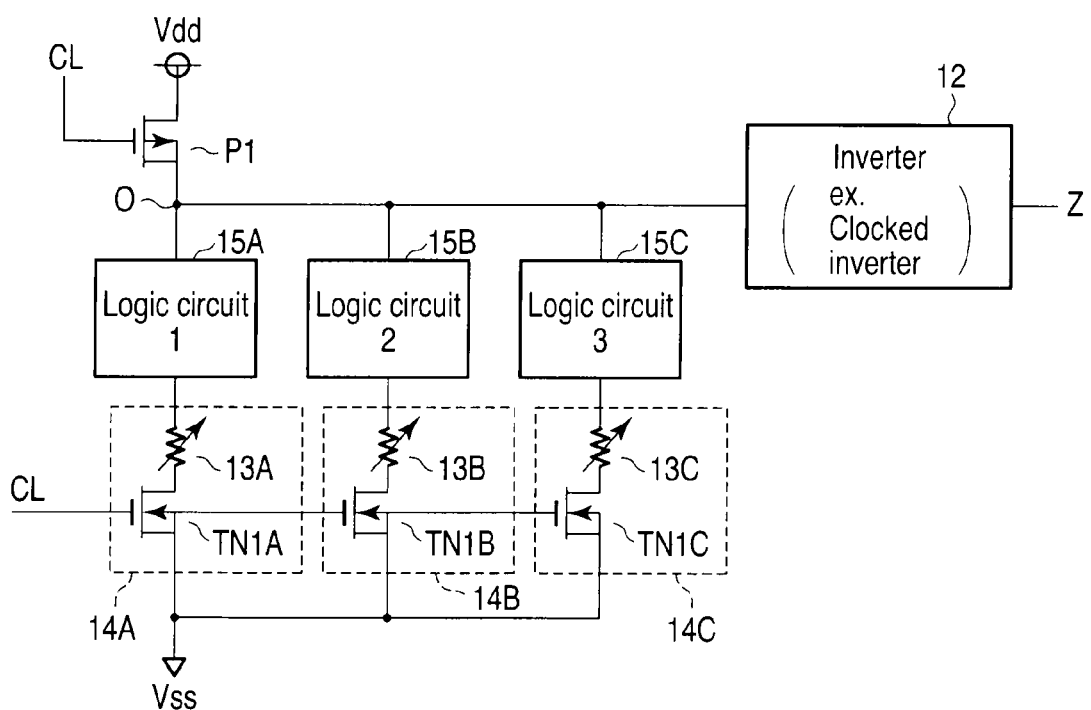
FIG. 17 is a circuit diagram showing a modification of the semiconductor integrated circuit in FIG. 15.

FIGS. 16 and 17 show modifications of the semiconductor integrated circuits in FIGS. 14 and 15.

In these modifications, three series connection units 14A, 14B, and 14C are connected in parallel between the first power supply potential Vss and the output terminal O. The clock signal CL is commonly input to the gate terminals of n-channel MISFETs TN1A, TN1B, and TN1C in the series connection units 14A, 14B, and 14C. The first power supply potential Vss is applied to their source terminals.

A logic circuit 15A is connected between series connection unit 14A and the output terminal O. A logic circuit 15B is connected between series connection unit 14B and the output terminal O. A logic circuit 15C is connected between series connection unit 14C and the output terminal O.

In this case, when a resistance change element 13A is in the low resistance state, the output signal from the logic circuit 15A is output to the output terminal O. When a resistance change element 13B is in the low resistance state, the output signal from the logic circuit 15B is output to the output terminal O. When a resistance change element 13C is in the low resistance state, the output signal from the logic circuit 15C is output to the output terminal O.

Hence, when one of the resistance change elements 13A, 13B, and 13C is set in the low resistance state, and the remaining resistance change elements are set in the high resistance state, the output signal from the logic circuit connected in series to the resistance change element in the low resistance state is selectively output.

That is, if the logic circuits 15A, 15B, and 15C have different logics, one of the three logics can selectively be output.

This modification also includes three logic circuits. However, the present invention is not limited to this. The function of switching different logics can be implemented using two or more logic circuits.

As described above, according to the fourth embodiment, it is possible to implement a reconfigurable logic circuit which can reconfigure a function of permitting/inhibiting output of the output signal from the logic circuit in accordance with data written in the resistance change element, and generates no through current in the normal operation mode.

The state of the resistance change element is nonvolatilely held even after power-off. Hence, the circuit can perform the same operation when powered on again.

(5) Others

In the first to fourth embodiments, each MISFET can be changed to a MESFET (Metal-Semiconductor Field Effect Transistor) or a JFET (Junction Field Effect Transistor).

3. Application Examples

According to the present invention, it is possible to implement various kinds of reconfigurable logic circuits by applying the above-described first to fourth basic circuits.

Typical examples will be described below.

(1) Multiplexer and OR-Circuit

FIG. 18 shows a logic circuit which can reconfigure a multiplexer and an OR-circuit.

This logic circuit is an application example of the first embodiment (FIG. 1). As a characteristic feature, a plurality of n-channel spin FETs SN1A, SN1B, . . . , and SN1C are connected in parallel between the first power supply potential Vss and the output terminal O.

The input signals A, B, . . . , and C are input to the gate terminals of the n-channel spin FETs SN1A, SN1B, . . . , and SN1C, respectively.

FIG. 19 shows a detailed example of the logic circuit in FIG. 18.

Three n-channel spin FETs are included. A clocked inverter is used as the inverter of the subsequent stage.

Table 3 is the truth table of the logic circuit in FIG. 19.

TABLE 3

Truth table

| State of spin FET SN1A | State of spin FET SN1B | State of spin FET SN1C | CL | Z | |
|---|---|---|---|---|---|
| Parallel | Antiparallel | Antiparallel | 1 | A | |
| Antiparallel | Parallel | Antiparallel | 1 | B | Multiplexer |
| Antiparallel | Antiparallel | Parallel | 1 | C | |
| Parallel | Parallel | Antiparallel | 1 | A + B | |
| Parallel | Antiparallel | Parallel | 1 | A + C | OR-circuit |
| Antiparallel | Parallel | Parallel | 1 | B + C | |
| Parallel | Parallel | Parallel | 1 | A + B + C | |

Parallel (low resistance)
Antiparallel (high resistance)

Each of the n-channel spin FETs SN1A, SN1B, and SN1C takes one of an antiparallel state (high resistance state) and a parallel state (low resistance state).

Assume that one of the n-channel spin FETs SN1A, SN1B, and SN1C is in the parallel state, and the two remaining n-channel spin FETs are in the antiparallel state. In this case, an input signal input to the spin FET in the parallel state appears as the output signal Z when the clock signal CL is "H (=1)".

For example, when the n-channel spin FET SN1A is in the parallel state, and the n-channel spin FETs SN1B and SN1C are in the antiparallel state, the input signal A appears as the output signal Z from the clocked inverter. When the n-channel spin FET SN1B is in the parallel state, and the n-channel spin FETs SN1A and SN1C are in the antiparallel state, the input signal B appears as the output signal Z from the clocked inverter.

The logic circuit in FIG. 19 thus functions as a multiplexer.

Assume that at least two of the n-channel spin FETs SN1A, SN1B, and SN1C are in the parallel state. In this case, the OR of at least two input signals input to the spin FETs in the parallel state appears as the output signal Z when the clock signal CL is "H (=1)".

Assume that the n-channel spin FETs SN1A and SN1B are in the parallel state, and the n-channel spin FET SN1C are in the antiparallel state. In this case, if at least one of the input signals A and B is "H", charges in the output terminal O are removed to the first power supply potential Vss. The output signal Z from the clocked inverter changes to "H". That is, the output signal Z from the clocked inverter is the OR (A+B) of the input signals A and B.

Assume that all the n-channel spin FETs SN1A, SN1B, and SN1C are in the parallel state. In this case, if at least one of the input signals A, B, and C is "H", charges in the output terminal O are removed to the first power supply potential Vss. The output signal Z from the clocked inverter changes to "H". That is, the output signal Z from the clocked inverter is the OR (A+B+C) of the input signals A, B, and C.

The logic circuit in FIG. 19 thus functions as an OR-circuit.

(2) AND-Circuit and OR-Circuit

FIG. 20 shows a logic circuit which can reconfigure an AND-circuit and an OR-circuit.

This logic circuit is an application example of the first embodiment (FIG. 1). As a characteristic feature, a plurality of (in this example, three) n-channel spin FETs SN1-1, SN1-2, and SN1-3 are connected in parallel between the first power supply potential Vss and the output terminal O. Additionally, an n-channel MISFET N1-1 is connected in series to the n-channel spin FET SN1-1.

The input signal A is input to the gate terminals of the n-channel spin FETs SN1-1 and SN1-3. The input signal B is input to the gate terminals of the n-channel spin FET SN1-2 and the n-channel MISFET N1-1.

Table 4 is the truth table of the logic circuit in FIG. 20.

TABLE 4

Truth table

| State of spin FET SN1-1 | State of spin FET SN1-2, SN1-3 | CL | Z |
|---|---|---|---|
| Parallel | Antiparallel | 1 | A · B |
| Antiparallel | Parallel | 1 | A + B |

Parallel (low resistance)
Antiparallel (high resistance)

Each of the n-channel spin FETs SN1-1, SN1-2, and SN1-3 takes one of an antiparallel state (high resistance state) and a parallel state (low resistance state).

Assume that the n-channel spin FET SN1-1 is in the parallel state, and the n-channel spin FETs SN1-2 and SN1-3 are in the antiparallel state. In this case, when the clock signal CL is "H (=1)", and both the input signals A and B are "H", charges in the output terminal O are removed to the first power supply potential Vss. The output signal Z from the inverter changes to "H". That is, the output signal Z from the inverter is the AND (A·B) of the input signals A and B.

Assume that the n-channel spin FET SN1-1 is in the antiparallel state, and the n-channel spin FETs SN1-2 and SN1-3 are in the parallel state. In this case, when the clock signal CL is "H (=1)", and at least one of the input signals A and B is "H", charges in the output terminal O are removed to the first power supply potential Vss. The output signal Z from the inverter changes to "H". That is, the output signal Z from the inverter is the OR (A+B) of the input signals A and B.

The logic circuit in FIG. 20 thus functions as an AND-circuit or an OR-circuit.

In this example, the n-channel MISFET N1-1 is connected in series to the n-channel spin FET SN1-1. The n-channel MISFET N1-1 may be changed to a spin FET. In this case, the spin FET is set in the same state as the n-channel spin FET SN1-1.

(3) Buffer and Inverter

FIG. 21 shows a logic circuit which can reconfigure a buffer and an inverter.

This logic circuit is an application example of the first embodiment (FIG. 1). As a characteristic feature, two n-channel spin FETs SN1 and SN2 are connected in parallel between the first power supply potential Vss and the output terminal O.

The input signal A is input to the gate terminal of the n-channel spin FET SN1. An inverted signal bA of the input signal A is input to the gate terminal of the n-channel spin FET SN2. An inverter including a p-channel MISFET P4 and an n-channel MISFET N4 generates the inverted signal bA of the input signal A.

Table 5 is the truth table of the logic circuit in FIG. 21.

TABLE 5

Truth table

| State of spin FET SN1 | State of spin FET SN2 | CL | Z |
|---|---|---|---|
| Parallel | Antiparallel | 1 | A |
| Antiparallel | Parallel | 1 | bA |

Parallel (low resistance)
Antiparallel (high resistance)

Each of the n-channel spin FETs SN1 and SN2 takes one of an antiparallel state (high resistance state) and a parallel state (low resistance state).

Assume that the n-channel spin FET SN1 is in the parallel state, and the n-channel spin FET SN2 is in the antiparallel state. In this case, when the clock signal CL is "H (=1)", the input signal A is obtained as the output signal Z from the inverter of the subsequent stage.

For example, if the input signal A is "H", the n-channel spin FET SN1 is turned on to remove charges in the output terminal O to the first power supply potential Vss. Hence, the output signal Z from the inverter of the subsequent stage changes to "H".

If the input signal A is "L", the n-channel spin FET SN1 is turned off. Hence, the output signal Z from the inverter of the subsequent stage changes to "L". At this time, the n-channel spin FET SN2 is turned on. However, since the n-channel spin FET SN2 is in the antiparallel state and has a very high ON resistance, charges in the output terminal O are not removed to the first power supply potential Vss.

The logic circuit thus functions as a buffer.

Assume that the n-channel spin FET SN1 is in the antiparallel state, and the n-channel spin FET SN2 is in the parallel state. In this case, when the clock signal CL is "H (=1)", the inverted signal bA of the input signal A is obtained as the output signal Z from the inverter of the subsequent stage.

For example, if the input signal A is "H", the n-channel spin FET SN2 is turned off. Hence, the output signal Z from the inverter of the subsequent stage changes to "L". At this time, the n-channel spin FET SN1 is turned on. However, since the n-channel spin FET SN1 is in the antiparallel state and has a very high ON resistance, charges in the output terminal O are not removed to the first power supply potential Vss.

If the input signal A is "L", the n-channel spin FET SN2 is turned on to remove charges in the output terminal O to the first power supply potential Vss. Hence, the output signal Z from the inverter of the subsequent stage changes to "H".

The logic circuit thus functions as an inverter.

(4) Complex Logic Circuit

FIG. 22 shows a logic circuit which can reconfigure three or more kinds of logics.

This logic circuit is an application example of the first embodiment (FIG. 1). As a characteristic feature, three n-channel spin FETs SN1-1, SN1-2, and SN1-3 are connected in parallel between the first power supply potential Vss and the output terminal O. Additionally, an n-channel MISFET N1-1 is connected in series to the n-channel spin FET SN1-1.

The input signal A is input to the gate terminal of the n-channel spin FET SN1-1. The input signal B is input to the gate terminals of the n-channel spin FET SN1-2 and the n-channel MISFET N1-1. The input signal C is input to the gate terminal of the n-channel spin FET SN1-3.

Table 6 is the truth table of the logic circuit in FIG. 22.

TABLE 6

Truth table

| State of spin FET SN1-1 | State of spin FET SN1-2 | State of spin FET SN1-3 | CL | Z |
|---|---|---|---|---|
| Parallel | Antiparallel | Antiparallel | 1 | A · B |
| Antiparallel | Parallel | Antiparallel | 1 | B |
| Antiparallel | Antiparallel | Parallel | 1 | C |
| Parallel | Parallel | Antiparallel | 1 | B |
| Parallel | Antiparallel | Parallel | 1 | A · B + C |
| Antiparallel | Parallel | Parallel | 1 | B + C |
| Parallel | Parallel | Parallel | 1 | B + C |

Parallel (low resistance)
Antiparallel (high resistance)

Each of the n-channel spin FETs SN1-1, SN1-2, and SN1-3 takes one of an antiparallel state (high resistance state) and a parallel state (low resistance state).

Assume that the n-channel spin FET SN1-1 is in the parallel state, and the n-channel spin FETs SN1-2 and SN1-3 are in the antiparallel state. In this case, when the clock signal CL is "H (=1)", and both the input signals A and B are "H", both the n-channel spin FET SN1-1 and the n-channel MISFET N1-1 are turned on.

Hence, charges in the output terminal O are removed to the first power supply potential Vss. The output signal Z from the inverter changes to "H". That is, the output signal Z from the inverter is the AND (A·B) of the input signals A and B.

Assume that the n-channel spin FET SN1-2 is in the parallel state, and the n-channel spin FET SN1-3 is in the antiparallel state. In this case, when the clock signal CL is "H (=1)", the output signal Z from the inverter is the input signal B. At this time, the state of the n-channel spin FET SN1-1 can be either the parallel state or the antiparallel state.

Assume that the n-channel spin FETs SN1-1 and SN1-2 are in the antiparallel state, and the n-channel spin FET SN1-3 is in the parallel state. In this case, when the clock signal CL is "H (=1)", the output signal Z from the inverter is the input signal C.

Assume that the n-channel spin FETs SN1-1 and SN1-3 are in the parallel state, and the n-channel spin FET SN1-2 is in the antiparallel state. In this case, when the clock signal CL is "H (=1)", the output signal Z from the inverter is the input signals A·B+C.

Assume that the n-channel spin FETs SN1-2 and SN1-3 are in the parallel state. In this case, when the clock signal CL is "H (=1)", and at least one of the input signals B and C is "H", charges in the output terminal O are removed to the first power supply potential Vss. The output signal Z from the inverter changes to "H". That is, the output signal Z from the inverter is the OR (B+C) of the input signals B and C. At this time, the state of the n-channel spin FET SN1-1 can be either the parallel state or the antiparallel state.

The logic circuit in FIG. 22 can thus implement three or more logics.

In this example, the n-channel MISFET N1-1 is connected in series to the n-channel spin FET SN1-1. The n-channel MISFET N1-1 may be changed to a spin FET. In this case, the spin FET is set in the same state as the n-channel spin FET SN1-1.

(5) Write Circuit

An example of a write circuit for writing data in a spin FET or a resistance change element will be explained. The write is done by, e.g., flowing a write current or applying a voltage to the spin FET or the resistance change element. The value of write data is controlled by the direction of the write current or voltage.

FIG. 23 shows an example of a write circuit.

The write circuit is added to the logic circuit in FIG. 1.

A driver/sinker D/S•1 is connected to the drain side of the n-channel spin FET SN1. A driver/sinker D/S•2 is connected to the source side.

The driver/sinker D/S•1 includes a p-channel MISFET P5 and an n-channel MISFET N5 which are connected in series between the first power supply potential Vss and the second power supply potential Vdd.

The driver/sinker D/S•2 includes a p-channel MISFET P6 and an n-channel MISFET N6 which are connected in series between the first power supply potential Vss and the second power supply potential Vdd.

To set the n-channel spin FET SN1 in the high resistance state, for example, the p-channel MISFET P5 and the n-channel MISFET N6 are turned on to flow a write current from the driver/sinker D/S•1 to the driver/sinker D/S•2.

To set the n-channel spin FET SN1 in the low resistance state, for example, the p-channel MISFET P6 and the n-channel MISFET N5 are turned on to flow a write current from the driver/sinker D/S•2 to the driver/sinker D/S•1.

In this way, the resistance value of the magnetic tunnel junction or magneto-semiconductor junction of the n-channel spin FET SN1 is changed.

In the write mode, the clock signal CL is set to "H (=1)". In the normal operation mode, the input signals B and D are set to "H", and the input signals C and E are set to "L", thereby making the drivers/sinkers D/S•1 and D/S•2 inoperative.

(6) Switching Box

Figure 24:
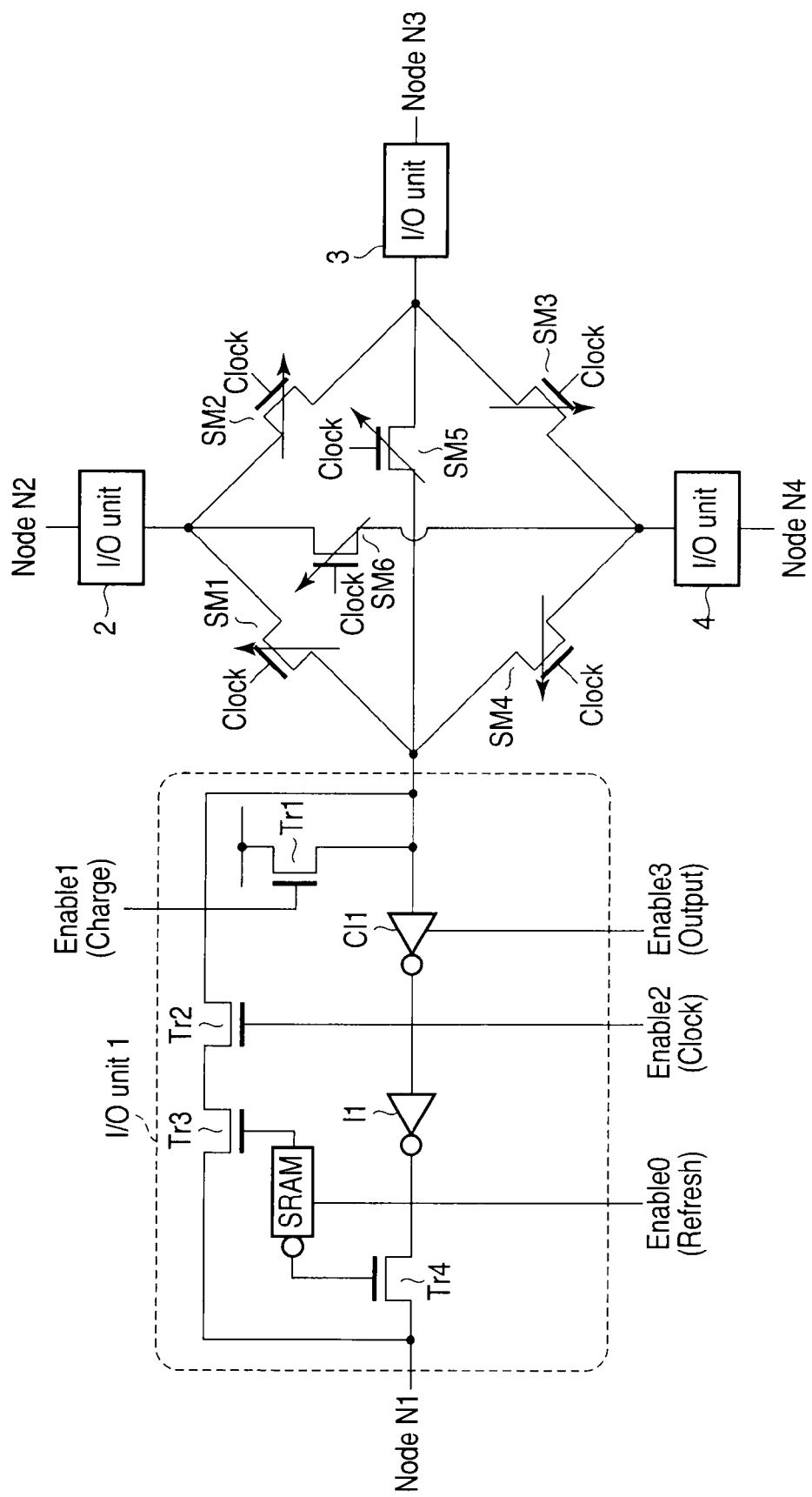
FIG. 24 is a circuit diagram showing an example of a switching box.

FIG. 24 shows a circuit example of a switching box including spin FETs.

This circuit includes I/O units 1, 2, 3, and 4 added to input/output nodes, and a pass transistor formed from spin FETs SM1 to SM6.

All the I/O units 1, 2, 3, and 4 have the same circuit arrangement. Only the circuit arrangement in the I/O unit 1 is illustrated as a typical example.

The operation of the circuit will be described below.

First, only a spin FET connected between two nodes to transmit a signal is set in the parallel state. The remaining spin FETs are set in the antiparallel state.

For example, to transmit a signal between nodes N1 and N2, only the spin FET SM1 is set in the parallel state. The remaining spin FETs SM2 to SM6 are set in the antiparallel state.

One of the two selected nodes is defined as an input node, and the other as an output node based on data in SRAMs in the I/O units.

For example, to use the node N1 as an output node, a transistor Tr3 in the I/O unit 1 is turned off, and a transistor Tr4 is turned on based on the output signal from the SRAM. This enables the path between an inverter I1 and a clocked inverter C11 which are connected in series. Conversely, to use the node N1 as an input node, the transistor Tr3 in the I/O unit 1 is turned on, and the transistor Tr4 is turned off based on the output signal from the SRAM. This enables the path between a transistor Tr2 and the transistor Tr3 which are connected in series.

In a charge cycle, a transistor Tr1 arranged in each node is turned on and then off to accumulate charges in the input portion of the clocked inverter C11 connected to the transistor Tr1. After that, an enable signal Enable2 (Clock) to be supplied to the gates of the transistor Tr2 and the spin FETs SM1 to SM6 is set to "H (=1)".

When transmitting a signal between the two nodes N1 and N2 while setting the node N1 as the input node, and the node N2 as the output node, the transistors Tr2 and Tr3 in the I/O unit 1 are turned on.

In this case, if the input signal from the node N1 is "L (=0)", charges accumulated in the input portions of the clocked inverters C11 in the I/O units 1 and 2 are removed to the node N1 via the transistors Tr2 and Tr3 in the I/O unit 1.

Hence, the level of the input portion of the clocked inverter in the I/O unit 2 changes to "L", and "L" is output to the node N2.

Conversely, if the input signal from the node N1 is "H", charges accumulated in the input portions of the clocked inverters C11 in the I/O units 1 and 2 are held.

Hence, the level of the input portion of the clocked inverter in the I/O unit 2 changes to "H", and "H" is output to the node N2.

When setting the node N1 as the output node, an enable signal Enable3 (Output) is supplied. An output signal is obtained in the node N1 in synchronism with this.

An enable signal Enable0 (Refresh) is used to refresh data stored in the SRAM.

The above-described operation allows to transmit a signal between two arbitrary nodes.

(7) Charge Period Control Reconfigurable Logic Circuit

All the above-described embodiments are directed with a so-called charge period control reconfigurable logic circuit which charges the output terminal in advance, and then controls the discharge period of the output terminal, thereby implementing a plurality of logics in accordance with the state of an n-channel spin FET or a resistance change element.

As an application example of the present invention, it is also possible to implement a so-called charge period control reconfigurable logic circuit (to be referred to as a charge period control logic circuit hereinafter) which discharges the output terminal in advance, and then controls the charge period of the output terminal, thereby implementing a plurality of logics in accordance with the state of an p-channel spin FET or a resistance change element.

In this case, the period from the end of output terminal discharge to the restart of output terminal discharge is set to be equal to a period in which the potential of the output terminal always has a value larger than the circuit threshold of a subsequent circuit (e.g., a logic circuit such as an inverter or a buffer) independently of the input signal when the magnetic tunnel junction or magneto-semiconductor junction is in the high resistance state.

Additionally, the period from the end of output terminal discharge to the restart of output terminal discharge is set to be equal to a period in which the potential of the output terminal has a value larger or smaller than the circuit threshold of a subsequent circuit (e.g., a logic circuit such as an inverter or a buffer) depending on the input signal when the magnetic tunnel junction or magneto-semiconductor junction is in the low resistance state.

A typical example will be described below.

FIG. 25 shows the first example of the charge period control logic circuit.

This example corresponds to the first embodiment in FIG. 1.

The input signal A is input to the gate terminal of a p-channel spin FET SP1. The first power supply potential (e.g., positive power supply) Vdd is applied to the source terminal. The output terminal O is connected to the drain terminal.

The clock signal CL is input to the gate terminal of an n-channel MISFET N1. The second power supply potential (e.g., ground potential) Vss lower than the first power supply potential Vdd is applied to the source terminal. The output terminal O is connected to the drain terminal.

The control circuit 11 outputs the clock signal CL and the input signal A.

The control circuit 11 includes any components (e.g., a logic circuit or a transfer gate of the preceding stage) which output the clock signal CL and the input signal A at the following operation timing.

The control circuit 11 sets the clock signal CL to "H" to turn on the n-channel MISFET N1 and start discharging the output terminal O. After that, the control circuit 11 sets the clock signal CL to "L" to turn off the n-channel MISFET N1 and end discharging the output terminal O. Then, the control circuit 11 supplies the input signal A to the gate terminal of the p-channel spin FET SP1.

The input terminal of an inverter 12 of the subsequent stage is connected to the output terminal O. The inverter 12 is, e.g., a clocked inverter.

The p-channel spin FET SP1 has, between the source terminal and the drain terminal, a magnetic tunnel junction or a magneto-semiconductor junction which takes one of a high resistance state and a low resistance state.

The high resistance state of the magnetic tunnel junction or magneto-semiconductor junction yields a resistance value at which the potential of the output terminal O always has a value smaller than the circuit threshold of the inverter 12 of the subsequent stage independently of the input signal A. That is, when the magnetic tunnel junction or magneto-semiconductor junction is in the high resistance state, passage of the input signal is inhibited.

The low resistance state of the magnetic tunnel junction or magneto-semiconductor junction yields a resistance value at which the potential of the output terminal O has a value larger or smaller than the circuit threshold of the inverter 12 of the subsequent stage depending on the input signal A. That is, when the magnetic tunnel junction or magneto-semiconductor junction is in the low resistance state, passage of the input signal is permitted.

The p-channel spin FET SP1 can employ the device structures shown in FIG. 2. FIG. 2 shows an n-channel spin FET. To apply it to this example, the semiconductor substrate 1 must be of n-type, and the source/drain diffusion layers 2A and 2B must be of p-type.

Figure 26:
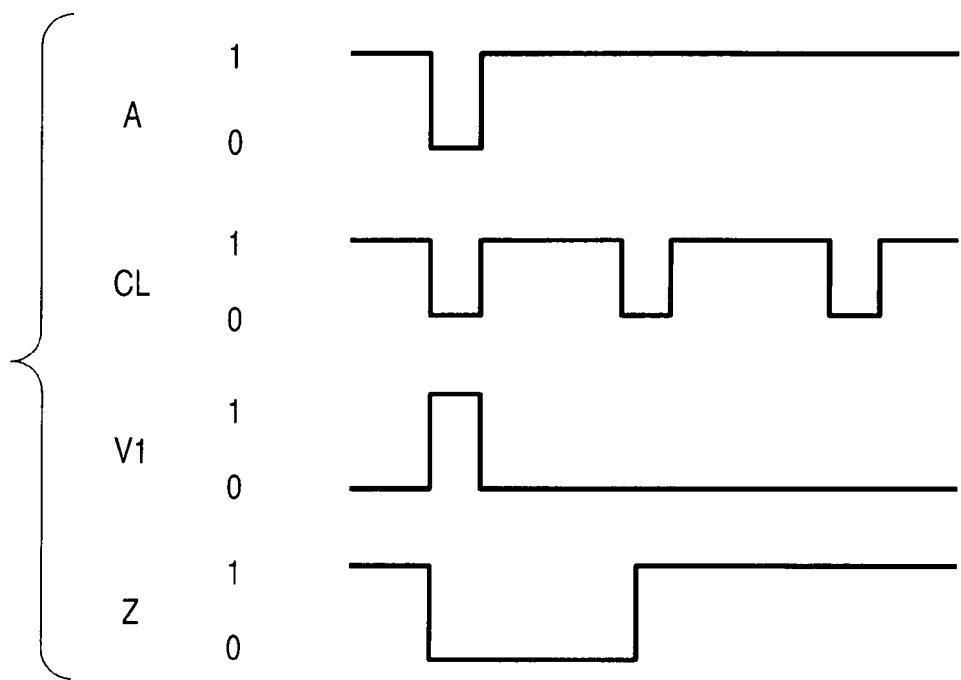
FIG. 26 is a timing chart showing waveforms in the circuit example in FIG. 25.

FIG. 26 shows operation waveforms in the circuit example shown in FIG. 25 when the p-channel spin FET SP1 is in the low resistance state.

When obtaining the operation waveforms, to prevent a through current, a p-channel MISFET having a gate terminal to receive the clock signal CL and connected between the first power supply potential Vdd and the p-channel spin FET SP1 is added to the circuit example in FIG. 25.

When the clock signal CL is "H (=1)", the n-channel MISFET N1 is ON so that the output terminal O is discharged to set V1 to "L (=0)". At this time, the input signal A is not input ("H").

When the clock signal CL changes from "H" to "L", the n-channel MISFET N1 is turned off to end discharging the output terminal O. For this reason, when the input signal A is input in the "L" state of the clock signal CL, the value of V1 is determined in accordance with the value of the input signal A.

For example, as shown in FIG. 26, when the input signal A is "L", charges from the first power supply potential Vdd are rapidly accumulated in the output terminal O via the p-channel spin FET SP1. Hence, V1 changes from "L" to "H". On the other hand, when the input signal A is "H", V1 remains "L".

As described above, when the p-channel spin FET SP1 is in the low resistance state, and the input signal A is "L", the output signal Z from the inverter 12 is "L". When the input signal A is "H", the output signal Z from the inverter 12 is "H".

Figure 27:
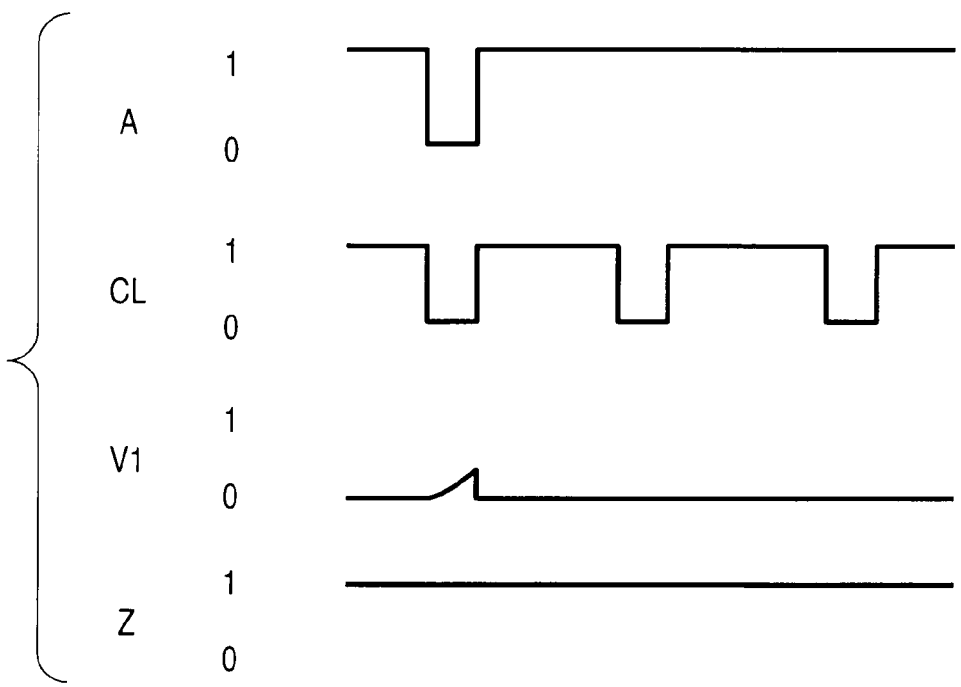
FIG. 27 is a timing chart showing waveforms in the circuit example in FIG. 25.

FIG. 27 shows operation waveforms in the circuit example shown in FIG. 25 when the p-channel spin FET SP1 is in the high resistance state.

When obtaining the operation waveforms, to prevent a through current, a p-channel MISFET having a gate terminal to receive the clock signal CL and connected between the first power supply potential Vdd and the p-channel spin FET SP1 is added to the circuit example in FIG. 25.

When the clock signal CL is "H (=1)", the n-channel MISFET N1 is ON so that the output terminal O is discharged to set V1 to "L (=0)". At this time, the input signal A is not input ("H").

When the clock signal CL changes from "H" to "L", the n-channel MISFET N1 is turned off to end discharging the output terminal O. In the high resistance state of the p-channel spin FET SP1, even when the input signal A is input in the "L" state of the clock signal CL, the value of V1 does not change in accordance with the value of the input signal A.

More specifically, when the input signal A is "L", the p-channel spin FET SP1 is turned on. Its ON resistance (the resistance value between the source terminal and the drain terminal) is very high. For this reason, the speed of moving charges from the first power supply potential Vdd to the output terminal O via the p-channel spin FET SP1 decreases. When the period of the clock signal CL is set such that the clock signal CL returns from "L" to "H" before the potential of V1 exceeds the circuit threshold of the inverter 12 of the subsequent stage, V1 remains "L" independently of the input signal A.

As described above, when the p-channel spin FET SP1 is in the high resistance state, the output signal Z from the inverter 12 is always "H" so that passage of the input signal A is inhibited.

As described above, according to the first example, it is possible to implement a reconfigurable logic circuit which can reconfigure a function of permitting/inhibiting passage of the input signal in accordance with data written in the p-channel spin FET, and generates no through current in the normal operation mode.

The magnetization state of the p-channel spin FET is non-volatilely held even after power-off. Hence, the circuit can perform the same operation when powered on again.

FIGS. 28 and 29 show the second example of the charge period control logic circuit.

This example corresponds to the second embodiment in FIGS. 8 and 9.

The series connection unit 14 includes a p-channel MISFET TP1 and the resistance change element 13. The first power supply potential (e.g., positive power supply potential) Vdd is applied to one terminal of the series connection unit 14. The output terminal O is connected to the other terminal.

The input signal A is input to the gate terminal of the p-channel MISFET TP1.

As the resistance change element 13, for example, a magnetoresistive element which changes the resistance value changes in accordance with the relative magnetization directions of a magnetization recording layer and a magnetization fixed layer, a resistance change element which changes the resistance value upon voltage application, or a phase-change element which changes the resistance value in accordance with a phase change is used.

As for the positional relationship between the p-channel MISFET TP1 and the resistance change element 13, the p-channel MISFET TP1 may be arranged on the side of the output terminal O, as shown in FIG. 28. Alternatively, the resistance change element 13 may be arranged on the side of the output terminal O, as shown in FIG. 29.

The example in FIG. 29 is more preferable than that in FIG. 28 from the viewpoint of the driving force of the p-channel MISFET TP1.

The clock signal CL is input to the gate terminal of the n-channel MISFET N1. The second power supply potential (e.g., ground potential) Vss lower than the first power supply potential Vdd is applied to the source terminal. The output terminal O is connected to the drain terminal.

The control circuit 11 outputs the clock signal CL and the input signal A.

The control circuit 11 includes any components (e.g., a logic circuit or a transfer gate of the preceding stage) which output the clock signal CL and the input signal A at the following operation timing, as in the first example.

The control circuit 11 sets the clock signal CL to "H" to turn on the n-channel MISFET N1 and start discharging the output terminal O. After that, the control circuit 11 sets the clock signal CL to "L" to turn off the n-channel MISFET N1 and end discharging the output terminal O. Then, the control circuit 11 supplies the input signal A to the gate terminal of the p-channel MISFET TP1.

The input terminal of the inverter 12 of the subsequent stage is connected to the output terminal O. The inverter 12 is, e.g., a clocked inverter.

The resistance change element 13 takes one of a high resistance state and a low resistance state.

The high resistance state yields a resistance value at which the potential of the output terminal O always has a value smaller than the circuit threshold of the inverter 12 of the subsequent stage independently of the input signal A. That is, passage of the input signal is inhibited in the high resistance state.

The low resistance state yields a resistance value at which the potential of the output terminal O has a value larger or smaller than the circuit threshold of the inverter 12 of the subsequent stage depending on the input signal A. That is, passage of the input signal is permitted in the low resistance state.

FIG. 30 shows the third example of the charge period control logic circuit.

This example corresponds to the third embodiment in FIG. 12.

The clock signal CL is input to the gate terminal of the p-channel spin FET SP1. The first power supply potential (e.g., positive power supply potential) Vdd is applied to the source terminal.

The clock signal CL is input to the gate terminal of the n-channel MISFET N1. The second power supply potential (e.g., ground potential) Vss lower than the first power supply potential Vdd is applied to the source terminal. The output terminal O is connected to the drain terminal.

The logic circuit 15 is connected between the output terminal O and the drain terminal of the p-channel spin FET SP1.

The input terminal of the inverter 12 of the subsequent stage is connected to the output terminal O. The inverter 12 is, e.g., a clocked inverter.

The p-channel spin FET SP1 has, between the source terminal and the drain terminal, a magnetic tunnel junction or a magneto-semiconductor junction which takes one of a high resistance state and a low resistance state.

The high resistance state of the magnetic tunnel junction or magneto-semiconductor junction yields a resistance value at which the output signal from the logic circuit 15 is not output to the output terminal O. That is, when the magnetic tunnel junction or magneto-semiconductor junction is in the high resistance state, output of the output signal from the logic circuit 15 is inhibited.

The low resistance state of the magnetic tunnel junction or magneto-semiconductor junction yields a resistance value at which the output signal from the logic circuit 15 is output to the output terminal O. That is, when the magnetic tunnel junction or magneto-semiconductor junction is in the low resistance state, output from the logic circuit 15 is permitted.

FIGS. 31 and 32 show the fourth example of the charge period control logic circuit.

This example corresponds to the fourth embodiment in FIGS. 14 and 15.

The series connection unit 14 includes the p-channel MISFET TP1 and the resistance change element 13. The first power supply potential (e.g., positive power supply potential) Vdd is applied to one terminal of the series connection unit 14. The output terminal is connected to the other terminal.

The clock signal CL is input to the gate terminal of the p-channel MISFET TP1.

As the resistance change element 13, for example, a magnetoresistive element which changes the resistance value changes in accordance with the relative magnetization directions of a magnetization recording layer and a magnetization fixed layer, a resistance change element which changes the resistance value upon voltage application, or a phase-change element which changes the resistance value in accordance with a phase change is used.

As for the positional relationship between the p-channel MISFET TP1 and the resistance change element 13, the p-channel MISFET TP1 may be arranged on the side of the output terminal O, as shown in FIG. 31. Alternatively, the resistance change element 13 may be arranged on the side of the output terminal O, as shown in FIG. 32.

The example in FIG. 32 is more preferable than that in FIG. 31 from the viewpoint of the driving force of the p-channel MISFET TP1.

The clock signal CL is input to the gate terminal of the n-channel MISFET N1. The second power supply potential (e.g., ground potential) Vss lower than the first power supply potential Vdd is applied to the source terminal. The output terminal O is connected to the drain terminal.

The input terminal of the inverter 12 of the subsequent stage is connected to the output terminal O. The inverter 12 is, e.g., a clocked inverter.

The resistance change element 13 takes one of a high resistance state and a low resistance state.

The high resistance state yields a resistance value at which the output signal from a logic circuit 15 is not output to the output terminal O. That is, output of the output signal from the logic circuit 15 is inhibited in the high resistance state.

The low resistance state yields a resistance value at which the output signal from the logic circuit 15 is output to the output terminal O. That is, output of the output signal from the logic circuit 15 is permitted in the low resistance state.

(8) Others

The spin FET can have two different state patterns. In one pattern, the spin FET has the high resistance state when the two magnetic materials of the magnetic tunnel junction or magneto-semiconductor junction are antiparallel, and the low resistance state when the magnetic materials are parallel. In the other pattern, the spin FET has the high resistance state when the two magnetic materials are parallel, and the low resistance state when the magnetic materials are antiparallel.

A detailed example of the latter is a junction structure formed from FeCo/Si/FeCo. This is described in, e.g., W. J. Hwang et al., "Spin transport in a lateral spin-injection device with an FM/Si/FM junction", Journal of Magnetism and Magnetic Materials 272-276 (2004) 1915-1916.

An ReRAM which is an example of the resistance change element will be described.

FIG. 33 shows the basic structure of a memory cell of an ReRAM.

A memory cell of an ReRAM includes a resistance change film 62 between a lower electrode 61 and an upper electrode 63. The following materials are usable for the resistance change film 62. For example, an amorphous oxide (e.g., the oxide of at least one element selected from the group consisting of Ti, V, Fe, Co, Y, Zr, Nb, Mo, Hf, Ta, W, Ge, and Si) is usable. The resistance change film 62 is sandwiched between an electrode made of Ag or Cu and an electrode made of TiW, Ti, or W. Voltages having different polarities are applied, thereby changing the current direction. This makes it possible to ionize Ag or Cu that is the electrode material and diffuse it into the thin film or return it to the electrode, thereby changing the resistance value of the resistance change film 62.

More specifically, when voltages are applied to make the Ag or Cu electrode have a positive potential, Ag or Cu of the electrode is ionized and diffused into the resistance change film 62. The ions are combined with electrons and deposited in the opposite electrode. This forms a current path including an enormous amount of Ag or Cu in the resistance change film 62, and the resistance of the resistance change film 62 decreases.

On the other hand, when voltages are applied to make the Ag or Cu electrode have a negative potential, Ag or Cu included in the current path formed in the resistance change film 62 moves in the opposite direction through the resistance change film 62 and returns to the Ag or Cu electrode. This increases the resistance of the resistance change film 62.

An arrangement using the following materials can also be adopted besides the above-described example. More specifically, a metallic oxide made of at least one of the transition metal elements of the VI group (except for $WO_3$) is used as the material of the resistance change film 62. Detailed examples are $Cr_2O_3$, $CrO_2$, $MoO_2$, $Mo_2O_5$, $WO_2$, a mixed crystal of $Cr_2O_3$ and $CrO_2$, a mixed crystal of $MoO_2$ and $Mo_2O_5$, and a mixed crystal of $WO_2$ and $WO_3$.

A metallic oxide made of at least one of transition metal elements of the VI group and at least one of transition metal elements of the I, II, VII, and VII groups may be used as the material of the resistance change film 62. Detailed examples are $NiCr_2O_4$, $MnCr_2O_4$, $FeCr_2O_4$, $CoCr_2O_4$, $CuCr_2O_4$, and $ZnCr_2O_4$.

These metallic oxides are preferably not amorphous but polycrystalline or microcrystalline. It is possible to increase or decrease the resistance of the resistance change film 62 by applying voltages having different polarities to these materials to change the current direction.

The ReRAM can employ a write method of changing the resistance value based on a current or a write method of changing the resistance value based on a voltage.

Only the basic structure of a memory cell of the resistance change memory has been described above. However, various modifications can also be made.

4. Example of Simulation

A simulation was performed for the circuit shown in FIG. 9.

Parameters used in the simulation are as follows.

A tunnel magnetoresistive element was used as the resistance change element. The resistance value of the magnetic tunnel junction in the low resistance state was 100 kΩ in sheet resistance. The resistance value of the magnetic tunnel junction in the high resistance state was 600 kΩ in sheet resistance. The pulse width of the clock signal was 350 psec.

In the low resistance state of the magnetic tunnel junction, when the clock signal was "H (=1)", and the input signal A was "H (=1)", transition of the output signal Z from the inverter from "L (=0)" to "H" was confirmed. Even after the clock signal changed from "H" to "L", the output signal Z maintained "H".

To the contrary, in the high resistance state of the magnetic tunnel junction, when the clock signal was "H", and the input signal A was "H", the output signal Z from the inverter remained "L".

As is apparent from the above result, use of the logic circuit shown in FIG. 9 allows to implement a logic circuit which permits transfer of the input signal A in the low resistance state and inhibits it in the high resistance state.

5. Advantages

According to the present invention, it is possible to eliminate a through current in a reconfigurable logic circuit and reduce power consumption.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
    an n-channel spin FET including one of a magnetic tunnel junction and a magneto-semiconductor junction which has one of a high resistance state and a low resistance state and which is located between a source terminal and a drain terminal, the n-channel spin FET including a gate terminal to receive an input signal, the source terminal to receive a first power supply potential, and the drain terminal connected to an output terminal;
    a p-channel FET including a gate terminal to receive a clock signal, a source terminal to receive a second power supply potential higher than the first power supply potential, and a drain terminal connected to the output terminal;
    a subsequent circuit connected to the output terminal; and
    a control circuit configured to start charging the output terminal by turning the p-channel FET on and turning the n-channel spin FET off, configured to end the charging of the output terminal by turning the p-channel FET and the n-channel spin FET off, and configured to input the input signal to the gate terminal of the n-channel spin FET after the charging ends.

2. The circuit according to claim 1, wherein the input signal has a low level and a high level, the input signal is set to the low level while the charging, and the input signal is set to one of the low and high levels.

3. The circuit according to claim 1, further comprising an n-channel FET which is
    connected between the first power supply potential and the source terminal of the n-channel spin FET and has a gate terminal to receive the clock signal,
        wherein the control circuit supplies the input signal to the gate terminal of the n-channel spin FET after the charging starts.

4. The circuit according to claim 1, further comprising a write circuit to change a resistance value of the one of the magnetic tunnel junction and the magneto-semiconductor junction.

5. The circuit according to claim 1, wherein the subsequent circuit is a clocked inverter controlled by the clock signal.

6. A semiconductor integrated circuit comprising:
    a series connection unit including a resistance change element which has one of a high resistance state and a low resistance state, and an n-channel FET including a gate terminal to receive an input signal connected in series, the series connection unit including one terminal to receive a first power supply potential, and the other terminal connected to an output terminal;
    a p-channel FET including a gate terminal to receive a clock signal, a source terminal to receive a second power supply potential higher than the first power supply potential, and a drain terminal connected to the output terminal;
    a subsequent circuit connected to the output terminal; and
    a control circuit configured to start charging the output terminal by turning the p-channel FET on and turning the n-channel FET off, configured to end the charging of the output terminal by turning the p-channel FET and the n-channel FET off, and configured to input the input signal to the gate terminal of the n-channel FET after the charging ends.

7. The circuit according to claim 6,
    wherein the input signal has a low level and a high level, the input signal is set to the low level while the charging, and the input signal is set to one of the low and high levels.

8. The circuit according to claim 6, further comprising an n-channel transistor which is connected between the first power supply potential and said one terminal of the series connection unit and has a gate terminal to receive the clock signal,
    wherein the control circuit supplies the input signal to the gate terminal of the n-channel FET after the charging starts.

9. The circuit according to claim 6, further comprising a write circuit to change a resistance value of the resistance change element.

10. The circuit according to claim 6, wherein a resistance value of the resistance change element changes based on relative magnetization directions of a first magnetic layer whose magnetization is variable and a second magnetic layer whose magnetization is invariable.

11. The circuit according to claim 6, wherein a resistance value of the resistance change element is changed by a voltage.

12. The circuit according to claim 6, wherein a resistance value of the resistance change element is changed by a phase change.

13. The circuit according to claim 6, wherein the subsequent circuit is a clocked inverter controlled by the clock signal.

14. A semiconductor integrated circuit comprising:
    an n-channel spin FET including one of a magnetic tunnel junction and a magneto-semiconductor junction which has one of a high resistance state and a low resistance state and which is located between a source terminal and a drain terminal, the n-channel spin FET including a gate terminal to receive a clock signal, and the source terminal to receive a first power supply potential;
    a p-channel FET including a gate terminal to receive the clock signal, a source terminal to receive a second power supply potential higher than the first power supply potential, and a drain terminal connected to an output terminal;
    a logic circuit which is connected between the output terminal and the drain terminal of the n-channel spin FET; and
    a subsequent circuit connected to the output terminal,
    wherein charging the output terminal is started by turning the p-channel FET on and turning the n-channel spin FET off, and the charging of the output terminal is ended by turning the p-channel FET off and turning the n-channel spin FET on, and wherein an output signal from the logic circuit is not output to the output terminal after the charging ends when the n-channel spin FET has the high resistance state, and the output signal from the logic circuit is output to the output terminal after the charging ends when the n-channel spin FET has the low resistance state.

15. The circuit according to claim 14, further comprising a write circuit to change a resistance value of the one of the magnetic tunnel junction and the magneto-semiconductor junction.

16. The circuit according to claim 14, wherein the subsequent circuit is a clocked inverter controlled by the clock signal.

17. A semiconductor integrated circuit comprising:
a series connection unit including a resistance change element which has one of a high resistance state and a low resistance state, and an n-channel FET including a gate terminal to receive a clock signal connected in series, the series connection unit including one terminal to receive a first power supply potential;
a p-channel FET including a gate terminal to receive the clock signal, a source terminal to receive a second power supply potential higher than the first power supply potential, and a drain terminal connected to an output terminal;
a logic circuit which is connected between the output terminal and the other terminal of the series connection unit; and
a subsequent circuit connected to the output terminal,
wherein charging the output terminal is started by turning the p-channel FET on and turning the n-channel FET off, and the charging of the output terminal is ended by turning the p-channel FET off and turning the n-channel FET on, and
wherein an output signal from the logic circuit is not output to the output terminal after the charging ends when the resistance change element has the high resistance state, and the output signal from the logic circuit is output to the output terminal after the charging ends when the resistance change element has the low resistance state.

18. The circuit according to claim 17, further comprising a write circuit to change a resistance value of the resistance change element.

19. The circuit according to claim 17, wherein a resistance value of the resistance change element changes based on relative magnetization directions of a first magnetic layer whose magnetization is variable and a second magnetic layer whose magnetization is invariable.

20. The circuit according to claim 17, wherein a resistance value of the resistance change element is changed by a voltage.

21. The circuit according to claim 17, wherein a resistance value of the resistance change element is changed by a phase change.

22. The circuit according to claim 17, wherein the subsequent circuit is a clocked inverter controlled by the clock signal.

* * * * *